(12) United States Patent
Stecker et al.

(10) Patent No.: US 12,734,582 B2
(45) Date of Patent: Sep. 15, 2026

(54) ELECTRON BEAM ADDITIVE MANUFACTURING SYSTEM AND CONTROL COMPONENTS

(71) Applicant: SCIAKY, INC., Chicago, IL (US)

(72) Inventors: Scott Stecker, Willow Springs, IL (US); John Daniel O'Hara, Wheaton, IL (US); Kenn William Lachenberg, St. John, IL (US)

(73) Assignee: Sciaky, Inc., Chicago, IL (US)

( * ) Notice: Subject to any disclaimer, the term of this patent is extended or adjusted under 35 U.S.C. 154(b) by 0 days.

(21) Appl. No.: 18/772,642

(22) Filed: Jul. 15, 2024

(65) Prior Publication Data

US 2024/0367232 A1 Nov. 7, 2024

Related U.S. Application Data

(62) Division of application No. 16/647,184, filed as application No. PCT/US2018/054827 on Oct. 8, 2018, now Pat. No. 12,036,604.

(Continued)

(51) Int. Cl.

*B22F 10/28* (2021.01)
*B22F 7/06* (2006.01)

(Continued)

(52) U.S. Cl.

CPC .............. *B22F 10/28* (2021.01); *B22F 7/064* (2013.01); *B22F 10/22* (2021.01); *B22F 10/25* (2021.01);

(Continued)

(58) Field of Classification Search

CPC .......... B22F 10/22; B22F 10/25; B22F 10/28; B22F 10/32; B22F 10/64; B22F 10/66; B22F 12/20; B22F 12/37; B22F 12/45; B22F 12/46; B22F 12/55; B22F 12/90; B22F 2003/248; B22F 2203/03; B22F 2998/10; B22F 2999/00; B22F 7/064; B23K 15/0086; B23K 15/06; B23K 35/0227;

(Continued)

(56) References Cited

U.S. PATENT DOCUMENTS

| | | | |
|---|---|---|---|
| 4,898,317 | A | 2/1990 | Ito et al. |
| 4,920,776 | A | 5/1990 | Denzler |

(Continued)

FOREIGN PATENT DOCUMENTS

| | | | |
|---|---|---|---|
| AU | 2017204522 | A1 | 7/2017 |
| CN | 106624323 | A | 5/2017 |

(Continued)

OTHER PUBLICATIONS

International Search Report and Written Opinion dated Jan. 25, 2019, Application No. PCT/US2018/054827.

*Primary Examiner* — John J Norton
*Assistant Examiner* — Dilnessa B Belay
(74) *Attorney, Agent, or Firm* — The Dobrusin Law Firm, P.C.; Daniela M. Thompson-Walters

(57) ABSTRACT

A layer manufacturing apparatus comprising: (a) a main chamber; (b) one or more energy emission devices; (c) one or more work piece supports; (d) a plurality of material delivery devices; wherein the plurality of material delivery devices are connected to one or more spools that are located external of the main chamber.

20 Claims, 12 Drawing Sheets

Related U.S. Application Data

(60) Provisional application No. 62/569,698, filed on Oct. 9, 2017.

(51) Int. Cl.

| | |
|---|---|
| ***B22F 10/22*** | (2021.01) |
| ***B22F 10/25*** | (2021.01) |
| ***B22F 10/32*** | (2021.01) |
| ***B22F 10/64*** | (2021.01) |
| ***B22F 12/20*** | (2021.01) |
| ***B22F 12/37*** | (2021.01) |
| ***B22F 12/45*** | (2021.01) |
| ***B22F 12/46*** | (2021.01) |
| ***B22F 12/55*** | (2021.01) |
| ***B22F 12/90*** | (2021.01) |
| ***B23K 15/00*** | (2006.01) |
| ***B23K 15/06*** | (2006.01) |
| ***B33Y 10/00*** | (2015.01) |
| ***B33Y 30/00*** | (2015.01) |
| ***B33Y 40/10*** | (2020.01) |
| ***B33Y 40/20*** | (2020.01) |
| ***C21D 1/30*** | (2006.01) |
| ***H01J 37/317*** | (2006.01) |
| *B22F 10/66* | (2021.01) |

(52) U.S. Cl.

CPC .............. *B22F 12/45* (2021.01); *B22F 12/55* (2021.01); *B23K 15/0086* (2013.01); *B23K 15/06* (2013.01); *B33Y 10/00* (2014.12); *B33Y 30/00* (2014.12); *B33Y 40/10* (2020.01); *B33Y 40/20* (2020.01); *C21D 1/30* (2013.01); *B22F 10/32* (2021.01); *B22F 10/64* (2021.01); *B22F 10/66* (2021.01); *B22F 12/20* (2021.01); *B22F 12/37* (2021.01); *B22F 12/46* (2021.01); *B22F 12/90* (2021.01); *B22F 2998/10* (2013.01); *H01J 37/317* (2013.01)

(58) Field of Classification Search

CPC ...... B23K 26/342; B33Y 10/00; B33Y 30/00; B33Y 40/10; B33Y 40/20; B33Y 50/02; C21D 1/30; C21D 10/00

See application file for complete search history.

(56) References Cited

U.S. PATENT DOCUMENTS

| | | | | |
|---|---|---|---|---|
| 5,534,314 | A | 7/1996 | Wadley | |
| 5,669,433 | A | 9/1997 | Sterett et al. | |
| 5,736,073 | A | 4/1998 | Wadley et al. | |
| 5,871,805 | A | 2/1999 | Lemelson | |
| 5,960,853 | A | 10/1999 | Sterett et al. | |
| 6,193,923 | B1 | 2/2001 | Leyden et al. | |
| 6,401,001 | B1 | 6/2002 | Jang et al. | |
| 6,405,095 | B1 | 6/2002 | Jang et al. | |
| 6,459,951 | B1 | 10/2002 | Griffith et al. | |
| 6,680,456 | B2 | 1/2004 | Adams | |
| 7,073,561 | B1 | 7/2006 | Henn | |
| 7,168,935 | B1 | 1/2007 | Taminger et al. | |
| 7,326,377 | B2 | 2/2008 | Adams | |
| 8,461,474 | B2 | 6/2013 | Wollenhaupt et al. | |
| 8,546,717 | B2 | 10/2013 | Stecker | |
| 8,598,523 | B2 | 12/2013 | Stecker | |
| 8,809,780 | B2 | 8/2014 | Wollenhaupt et al. | |
| 9,174,300 | B2 | 11/2015 | Stecker | |
| 9,399,264 | B2 | 7/2016 | Stecker | |
| 10,071,437 | B2 | 9/2018 | Stecker | |
| 10,189,114 | B2 | 1/2019 | Stecker | |
| 2003/0075836 | A1 | 4/2003 | Fong | |
| 2005/0173380 | A1 | 8/2005 | Carbone | |
| 2005/0288813 | A1 | 12/2005 | Yang et al. | |
| 2008/0296278 | A1 | 12/2008 | Meckler | |
| 2011/0061591 | A1* | 3/2011 | Stecker | B33Y 40/00 118/663 |
| 2013/0312928 | A1 | 11/2013 | Mercelis | |
| 2014/0014629 | A1 | 1/2014 | Stecker | |
| 2017/0043402 | A1 | 2/2017 | Di Serio | |
| 2017/0217093 | A1 | 8/2017 | DeMuth | |
| 2017/0239932 | A1* | 8/2017 | Knecht | B33Y 30/00 |
| 2018/0162013 | A1* | 6/2018 | Fulop | C09D 133/12 |
| 2019/0015924 | A1 | 1/2019 | Stecker | |
| 2019/0143445 | A1 | 5/2019 | Stecker | |

FOREIGN PATENT DOCUMENTS

| | | | |
|---|---|---|---|
| CN | 206230889 | U | 6/2017 |
| KR | 20170108906 | A | 9/2017 |
| WO | 2017/009094 | A1 | 1/2017 |

* cited by examiner 18
280
48
114
108
110
206
40
84
82
250
90
50
40
50
30
56
86
88
54
52
54
56
54'
54'
3B
46
64
44
42
34
32

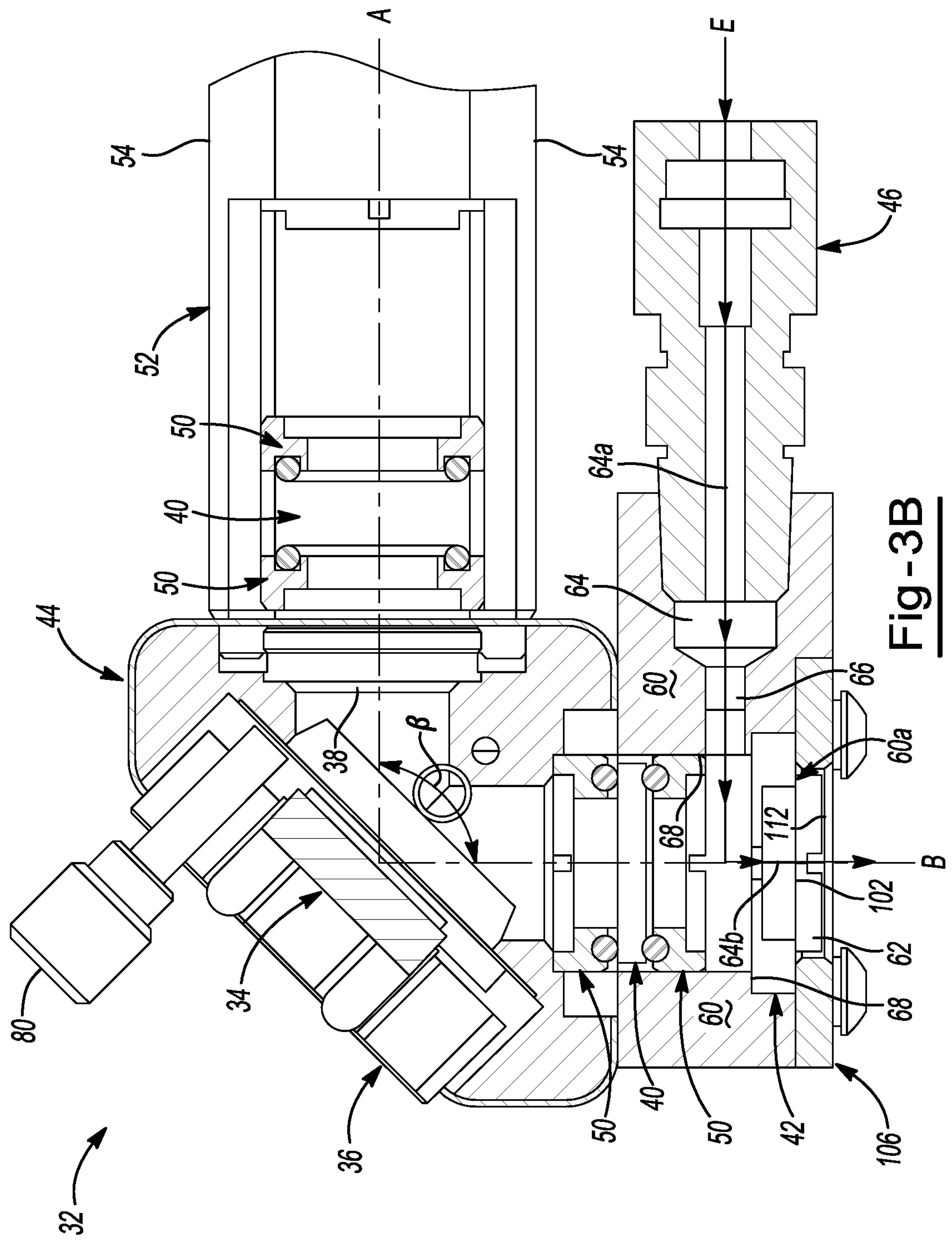

206
200
250
204
208
202
214
224
224
224
224
220
216
222
260
210
216
214
212
222
220
280
224
222
224
260
210
212
220
260
230
232
240
234
234

ELECTRON BEAM ADDITIVE MANUFACTURING SYSTEM AND CONTROL COMPONENTS

FIELD

The present teachings relate to layer manufacturing or fabrication of articles and, more specifically, to additive manufacturing or solid freeform fabrication of articles using an energy emission device and specifically an electron beam energy and a system with a plurality of feed wires and/or using multiple different raster patterns.

BACKGROUND

Free form fabrication (FFF) and additive manufacturing (AM) are names for a general class of layer manufacturing (LM), in which a three-dimensional (3-D) article is made by the sequential build-up of layers of material. More recently this three-dimensional buildup of an article using an electron beam is referred to as electron beam additive manufacturing (EBAM). Prior to physically building up the article, the process often begins with creating a computer aided design (CAD) file to represent the image or drawing of a desired article. Using a computer, information about this article image file is extracted, such as by identifying information corresponding to individual layers of the article. Thus, to derive data needed to form an article by LM, conceptually the article is sliced into a large number of thin layers with the contours of each layer being defined by a plurality of line segments or data points connected to form polylines. The layer data may be converted to suitable tool path data, such as data that is manipulated by or in the form of computer numerical control (CNC) codes, such as G-codes, M-codes, or the like. These codes may be utilized to drive a fabrication tool for building an article layer-by-layer.

One or more suitable LM techniques may be utilized for making articles, (e.g., such as by creating one or more device patterns directly on a substrate). The LM technique usually includes a step of selectively depositing material layer by layer, selectively removing material layer by layer, or a combination thereof. Many LM techniques are attractive in that they avoid the need for masks, for pre-existing three-dimensional patterns, and/or expensive tooling.

Historically, LM processes that use an energy emission device such as electron beams for melting a metal have been generally performed in an open loop fashion, which relies throughout substantially the entirety of the process upon human intervention, and particularly an operator, to adjust operating parameters. For example, an operator typically is obliged to visually observe the LM process throughout the layer by layer buildup, generally external of an LM apparatus and through a viewing port of the LM apparatus. If and when an operator detects a perceived departure from the buildup process, as forecasted, the operator needs to immediately change operating parameters. This approach may pose potential for complications due to the subjectivity of the observations of the operator, due to any delay experienced between an observation and any adjustment in operating parameters, and/or due to improper selection of parameters.

Accordingly, there continues to be a need in the art for an improved system and components for monitoring layer manufacturing to provide feedback controls and components that assist in implementing these controls for forming a three-dimensional article. More particularly, a system that provides automatic alteration of processing conditions based on information obtained from monitoring the layer manufacturing of the three-dimensional article.

Examples of efforts to provide layer manufacturing of articles and processes include those disclosed in U.S. Pat. Nos. 5,534,314; 5,669,433; 5,736,073; 5,871,805; 5,960,853; 6,401,001; 6,193,923; 6,405,095; 6,459,951; 6,680,456; 7,073,561; 7,168,935; 7,326,377; 8,461,474; 8,546,717; and 8,598,523; and US Patent Application Nos. 20030075836; 20050173380; and 20050288813, all of which are incorporated by reference for all purposes. What is needed is an EBAM system that includes multiple wire feed systems that work in conjunction to create an article. It would be attractive to have a modular system that is scalable according to a user's needs. What is needed is a control system that monitors attributes of an article and heat inputs and adjusts the raster patters to vary the attributes of the article. It would be attractive to have a control system that monitors one or more conditions and varies the electron beam power, feed rates of the feedstock, or both. It would be attractive to have a process where rastering is used to smooth an outside of a near net article, change a shape of a near net article before subjecting the article to a subsequent process. It would be attractive to have a device and/or method that assists in maintaining a feed plate in a planar fashion and/or reduces stress distortion when deposition is on a single side of the article.

SUMMARY

The present teachings seeks to improve upon prior LM apparatus and processes by providing a unique process and apparatus for fabrication of articles utilizing electron beam energy and closed loop controls. The present teachings make advantageous use of one or more unique features for allowing rapid article builds, especially aided by closed loop control operation, such as one or any combination of a vapor protective device as described herein, a cooled camera housing as described herein, an alignment fixture as described herein, substantially overhead imaging of molten pool deposits during a build as described herein, or any combination thereof.

The present teachings provide: an electron beam layer manufacturing apparatus comprising: (a) a main chamber; (b) one or more energy emission devices; (c) one or more work piece supports; (d) a plurality of material delivery devices; wherein the plurality of material delivery devices are connected to one or more spools that are located external of the main chamber.

The present teachings provide: a process comprising: (a) joining a first base substrate to a second substrate using an electron beam; (b) adding material to the first base substrate; (c) rotating the first base substrate and the second base substrate to a second side; (d) adding material to the second base substrate; (e) rotating the first base substrate and the second base substrate to a first side; and (f) repeating steps b.-e. until an article of manufacture is created on the first base substrate and the second base substrate.

The present teachings provide: a process comprising: (a) joining a first base substrate to a second base substrate; (b) adding material to the first base substrate with an energy source; (c) rotating the first base substrate and the second base substrate to a second side; (d) adding material to the second base substrate with the energy source; (e) rotating the first base substrate and the second base substrate to a first side; and (f) repeating steps b.-e. until an article of manufacture is created on the first base substrate and the second base substrate.

The present teachings pertains generally to a process for layer manufacturing of a three-dimensional work piece comprising the steps of: feeding raw material in a solid state to a first predetermined location (e.g., in the form of a bead, such as an elongated bead such as from a wire that may have an average width of about 3 to about 20 mm, preferably about 10 to about 15 mm (e.g., about 12.7 mm)); depositing the raw material onto a substrate as a molten pool deposit under a first processing condition; monitoring the molten pool deposit for a preselected condition using an image generating device substantially contemporaneously with the depositing step (e.g. using an optical imaging device, such as a digital camera having: (i) electronic components enclosed in a temperature controlled housing; (ii) a vapor protection device; or (iii) both (i) and (ii)); comparing information about the preselected condition of the monitored molten pool deposit with a predetermined value for the preselected condition of the monitored molten pool deposit; solidifying the molten pool deposit; automatically altering the first processing condition to a different processing condition based upon information obtained from the comparing step; and repeating the above steps at one or more second locations for building up layer by layer a three-dimensional work piece. The steps may be performed at a rate sufficient to deposit successive layers at least about 0.5 $cm^3$/hr to at least about 2.0 $cm^3$/hr (e.g. about 1.54 $cm^3$/hr), more preferably at least about 2.0 $cm^3$/hr to at least about 5.0 $cm^3$/hr. The steps may be performed at a rate sufficient to deposit successive layers at least about 2.5 kg of the raw material per hour, preferably at least 3 kg per hour (e.g., about 3.3 to about 6.8 kg per hour or higher). The steps may be performed at a rate sufficient to deposit the raw material as a plurality of beads that define successive layers having an average bead width of about 10 to about 15 mm (e.g., about 12.7 mm) at a rate of at least about 25 cm of bead per minute (e.g., about 35 to 80 cm per minute or higher).

The present teachings in addition to a monitoring step may include a step of cooling a detector by flowing a fluid in a housing of the detector for removing heat from the detector, wherein the cooled camera housing comprises: a front flange; at least one spacer pad connected to the front flange; at least one seal adjoining the spacer pad (e.g., located in-between a plurality of spacers, the front flange and spacers, or both); a rear flange connected to the front flange and sandwiching therebetween the at least one spacers and seals; wherein the front flange, the at least one seal, the at least one spacer pad, and the rear flange form an interior cavity; a plurality of printed circuit boards located within the interior cavity; an image detector; and wherein at least one of the flanges (e.g., the front flange) includes an inlet, an outlet, a fluid passage between the inlet and the outlet through which the fluid is passed for cooling the printed circuit boards during their operation, and optionally a mount adapter.

The present teachings also contemplates an apparatus for LM fabrication of a three-dimensional article comprising: a material delivery device for delivering raw material in a solid state; an electron beam gun energy emission device that emits electrons for melting the raw material to form a molten pool deposit; a work piece support upon which a work piece is formed layer by layer from a plurality of successively deposited molten pool deposits; a detector that monitors a preselected condition of the deposited material; a closed loop electronic control device for controlling operation of one or more components of the apparatus in response to a detected condition by the detector; and a housing defining a chamber within which the work piece is formed layer by layer from a plurality of successively deposited molten pool deposits; wherein the relative positions of two or more of the material delivery device, the energy emission device, the work piece support, or the detector changes during use of the system in at least the x, y, and z orthogonal axes for layer by layer buildup of an article.

The present teachings afford a robust system for gathering valuable data about a melt pool deposit substantially in real time. By way of illustration, the detectors may be capable of capturing and process at least about 25, 30, 40, 50, or even 60, or more images per second. The processes herein contemplate operating the detectors at such rates or faster rates. In this manner, substantially real-time data may be obtained about the deposited material that takes into account dynamic and unpredictable thermal conditions experienced by the work piece as a result of the layer by layer buildup and ongoing changes to dimensions and geometries of the work piece.

The apparatus may have associated with it a vapor protection device that comprises: a block that includes a base portion and a cover portion, the base portion including at least one fluid port that receives a gas stream that may be controllably regulated, the base portion and the cover portion each having an aperture that is generally axially aligned with each other and is adapted to be axially aligned substantially overhead of a molten metal pool deposit; at least one reflective substrate that is in optical communication with at least one of the apertures of the cover portion, or the base portion, for reflecting an image that passes through such aperture to a separately housed optical imaging device that records the image; wherein the gas stream enters the at least one fluid port and exits the block through one of the apertures, and provides an optically transparent protective barrier to prevent passage of metal vapor through the other aperture.

It should be appreciated that the above referenced aspects and examples are non-limiting as others exist with the present teachings, as shown and described herein. For example, any of the above-mentioned aspects or features of the present teachings may be combined to form other unique configurations, as described herein, demonstrated in the drawings, or otherwise.

BRIEF DESCRIPTION OF THE DRAWINGS

FIG. 3B illustrates an enlarged view of components of a vapor protection device shown in FIG. 3A.

DETAILED DESCRIPTION

Figure 1A:
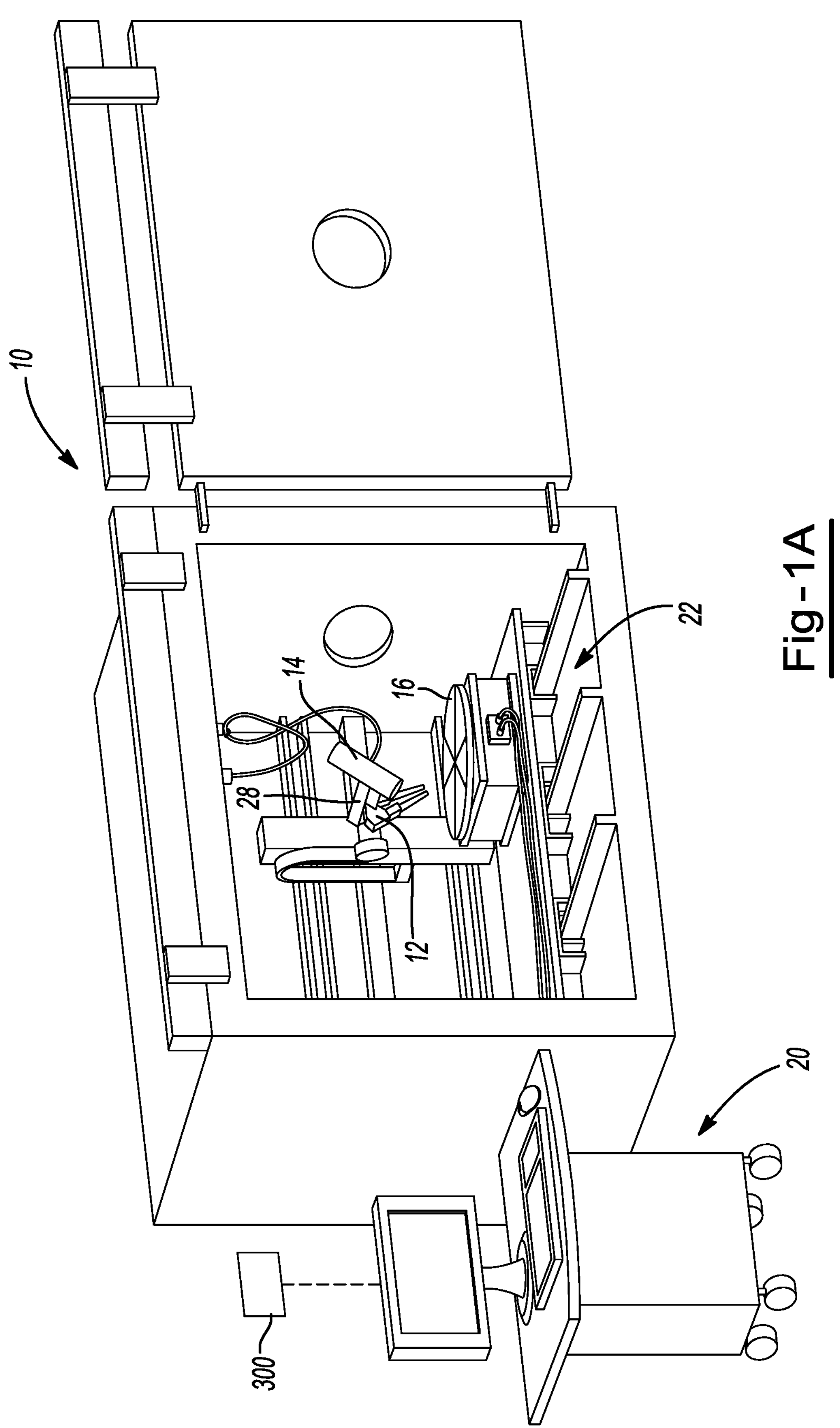
FIG. 1A is a general perspective view of an example of hardware useful for a system in accordance with the present teachings and a view of a chamber of an apparatus of the present teachings.

The present teachings provide an apparatus and process for layer manufacturing (LM) of a three-dimensional article. The present teachings are particularly directed at an apparatus and process for LM that provides high output rates. For example, it is possible that article (e.g., metallic article) build rates of at least about 0.5, 1.0, 1.5, 2.5, 3.5, or even 4.0 $cm^3$/hr, or higher, may be employed. It is also possible that, article (e.g., metallic article) build rates of at least about 2.5, 3.0, 3.3, 5, or even 6.8 kg/hour (e.g. having an average bead width of about 10 to about 15 mm) may be employed.

In general, the apparatus may include combinations of at least two or more of a material delivery device (e.g. a wire feed device); an energy emission device that applies energy to liquefy a material (e.g., a metal) delivered by the material delivery device; a work piece support onto which liquefied material is deposited; a closed loop control device (e.g., one that is in signaling communication with at least one or more of the material delivery device, energy emission device, or work piece support); a detector (e.g. a digital camera having (i) electronic components enclosed in a temperature controlled housing; (ii) a vapor protection device; or (iii) both (i) and (ii)) that detects a condition of material that has been deposited (e.g., by employing at least one solid state sensing device for generating an image of the deposited material substantially in real time) and supplies information about the condition to the control device so that the control device can change an operating parameter in response to the detected condition; and a housing that at least partially encloses some or all of the above components. In general, the process may include supplying a material (e.g., a wire feed material); liquefying the material (e.g., by applying energy, such as from an electron beam); depositing liquefied material onto a work piece support as a molten pool deposit; monitoring the molten pool deposit; and controlling operation of the process using a closed loop control system for changing an operating parameter in response to a detected condition of the molten pool deposit. The apparatus and the process may make use of an optical imaging detector that captures and processes data about images substantially in real time, and particularly a camera system that: (i) may be operated at a rate of at least about 25, 30, 40, 50, or even 60 or more frames per second; (ii) may derive its images substantially overhead of the melt deposit; (iii) may be operated for extended periods (e.g., at least 8, 24, 72, or even 144 hours or longer) without buildup of image distorting vapors on any optical components; (iv) includes processing electronics that are maintained at a temperature below about 500, 400, 200, or even 100° C.; or any combination of (i)-(iv).

The present teachings provide an LM apparatus that includes one or more material delivery devices for delivering raw material in a solid state (which may include at least one metal, which may be in the form of a wire); an energy emission device (e.g., an electron beam gun that controllably emits an electron beam); a work piece support (e.g., a support that is motor-translated); a detector (e.g. including a camera); an electronic control system with a suitable control device (preferably including at least one microprocessor); and a chamber. At least a portion of one or more of the components (e.g., the control system, a computer, or both) may reside outside of the chamber. The control system may be in controlling communication with one or more of the material delivery device, energy emission device, work piece support, or detector. The energy emission device emits energy for melting the raw material to form a molten pool deposit on a work piece support (e.g., onto a previous layer deposited onto a work piece support). The work piece support, the energy emission device, and/or the material delivery device may be positionally translatable relative to each other, so that a work piece can be formed layer by layer from a plurality of successively deposited (and solidified) molten pool deposits.

The detector monitors (e.g., using an optical technique) a preselected condition of the deposited material, for example, bulk average temperature of the molten pool deposit, temperature gradient within the molten pool deposit, surface topography of the molten pool deposit, the presence of any liquid-solid interface in the molten pool deposit, surface profile (e.g., shape) of the molten pool deposit, chemical analysis of the molten pool deposit, raw material entry location, raw material height, raw material orientation, or any combination thereof. The detector may obtain an image from a location substantially overhead of the molten pool deposit so that a material feed wire may be imaged substantially as the wire is melted. The detector may communicate (directly or indirectly via another microprocessor that signally communicates with the control system) information obtained about the preselected condition to the closed loop electronic control device.

The closed loop electronic control system may then signally control (directly or indirectly) operation of one or more components of the apparatus in response to a detected condition. The control device may operate by altering one or more conditions. For example, one or more of the conditions altered may be the location of any energy emission device for supplying energy to melt the raw material; the location of any material delivery device used for feeding the raw material; the location of the work piece support upon which a work piece is built; the pressure of any environment in which the processing is performed; the temperature of any environment in which the processing is performed; the voltage or other energy supplied to melt the raw material; the beam used for any electron beam source of energy for melting the raw material (e.g., the beam focus, the beam power, beam raster pattern, or otherwise); the feed rate of the raw material; the composition of the deposited material; the temperature of the work piece; the temperature of the platform; a raster pattern, a speed or rastering, or any combination thereof. The detector and control device make it possible to perform an LM process automatically, and especially without the need for operator intervention (e.g., without the need for complete reliance upon subjective human operator observations about operating conditions, without the need for complete reliance upon manual adjustment of one or more operating parameters by a human operator, or both).

Use of the processes and apparatus may require a vacuum, so that a reduction of pressure below atmospheric pressure is achieved. Thus, the apparatus may have its components at least partially enclosed within a walled structure defining a chamber, which may be sealed, and within which the work piece may be formed layer by layer from a plurality of successively deposited molten pool deposits. The relative positions of two or more of the material delivery device, the energy emission device, the work piece support, or the detector may change during use of the processes and apparatus herein.

The LM apparatus includes one or more material delivery devices for delivering raw material in a solid state. Preferably, the LM apparatus includes multiple material delivery devices (e.g., 2, 3, 4, or even 5). The material delivery devices may be structurally connected to a wall defining the chamber either via direct structural attachment or via an arm that permits reorientation of the material delivery device with respect to the energy emission device. The material delivery devices may include one or more frame structures that carry individual components, for example, a raw material holder (e.g., an arm that rotatably carries a spool of wire), a wire straightener, a motor, a sensor, or any combination thereof. A plurality of material delivery devices may be connected to a single frame. Each material delivery device may be connected to its own frame. The plurality of material delivery devices may be fixed relative to each other (e.g., as an arm moves all of the material delivery devices move with the arm). The plurality of material delivery devices may move relative to one another. The material delivery devices may be located so that an angle (relative to the circumference of the electron beam) is located between the material delivery devices. The material delivery devices may be located apart by about 15 degrees or more, about 30 degrees or more, about 45 degrees or more, about 60 degrees or more, about 75 degrees or more, about 105 degrees or more, about 135 degrees or more, or about 160 degrees or more. The material delivery devices may be located apart by about 180 degrees or less or about 175 degrees or less. The material delivery devices may move with or about an energy emission device so that the material delivery devices rotate about or moves relative to the workpiece, the energy emission device, another material delivery device, or a combination thereof. All of the plurality of material delivery devices may be located on a leading side of the electron beam (i.e., a side of the beam where the electron beam moves toward the material coming out of the material delivery device). One material delivery device may have multiple feeders so that a single material delivery device is capable of feeding two or more materials. Both material delivery devices may be located on a trailing side of the electron beam (i.e., the beam moves away from the feed stock). One material delivery device may be located on a leading side and one material delivery device may be located on the trailing side. The material delivery devices may be movable relative to each other. The material delivery devices may be movable along a frame, around the electron beam, on a track, on an articulating arm, or a combination thereof. The material delivery devices may be moved depending upon the intensity of the electron beam, the type of material being used, or both. For example, a material delivery device may be moved to a trailing position so that the material is pre-heated by the melt pool as the material moves towards the electron beam. Conversely, if the material is becoming too hot the material delivery device may be moved toward a leading position. Optionally, the material delivery devices may be adapted so that the material delivery devices are mounted to a portion of the energy emission device (e.g., a wire feed device may be mounted to an electron beam gun). The material delivery device may attach via direct structural attachment or via a positioning mechanism that permits desired orientation of the material delivery device with respect to the energy emission device. Each material delivery device may include one or more spools.

The one or more spools may function to provide feedstock to the material delivery device so that the material delivery device can feed the feedstock into the electron beam. The one or more spools may move with the material delivery devices. The one or more spools may be located outside of the chamber and the feedstock may be fed into the chamber though the material delivery device to a location of interest. The one or more spools may each carry a single wire. Each spool may carry one or more wires. Each spool may carry two wires and the two wires may be fed into the system via the material delivery device. For example, two wires may be connected together by a mechanical attachment such as melting or twisting. The material delivery device may be connected to two or more spools. The material delivery device may feed one feedstock at a time. The material delivery devices may feed more than one feedstock at a time. The material delivery device may feed one feedstock from one spool while a second feedstock is loaded into the material delivery device so that once a spool runs out the next spool may be used to supply feedstock. The material delivery device may alternate between two or more feedstocks or supply both feedstocks simultaneously. Each of the spools may include the same material, different material, different alloys, or a combination thereof. The material on the spools may be selected to create a predetermined alloy, microstructure, or both. The one or more spools may be located on a top of the chamber. The one or more spools may be located on a side wall of the chamber. The one or more spools may be located outside of the chamber but within a separate structure that is independently controlled. For example, the spool may be located within a separate vacuum chamber (e.g., an adjacent chamber) so that the spool is not subjected to the temperature and vapor of the chamber, but the feedstock may be feed into the chamber (e.g., main chamber) without adversely affecting the vacuum of the main chamber. The adjacent chamber may be free of a separate vacuum but a seal may restrict air from flowing from the adjacent chamber into the main chamber. The adjacent chamber over time may become a negative pressure or a vacuum environment. The spool may be located proximate to a seal in a wall of the chamber so that the feedstock may extend through the wall of the chamber without the chamber losing vacuum through the chamber.

The material delivery devices may deliver material (e.g., feedstock) to the electron beam at the same angle. Each of the material delivery devices may be angle adjustable. The material delivery devices may be angle adjustable relative to each other, the energy emission device, the workpiece, or a combination thereof. The material may be feed into the electron beam at an angle of about 5 degrees or more, about 10 degrees or more, about 20 degrees or more, about 30 degrees or more, or about 45 degrees or more relative to vertical. The material may be feed into the electron beam at an angle of about 135 degrees or less, about 115 degrees or less, about 105 degrees or less, about 90 degrees or less, about 75 degrees or less, or about 60 degrees or less relative to vertical. For example, one feed stock may be fed on a trailing side and may be fed at an angle of about 25 degrees (e.g. 65 degrees) from vertical and a second feed stock may be fed on a leading side at an angle of about 25 degrees from vertical (e.g., 115 degrees). The material delivery device may move so that an angle of the material may be varied over the course of creating a 3-D part. For example, one piece of material may be fed into the electron beam at an angle of about 30 degrees or less and one or more piece may be fed into the electron beam at an angle of about 45 degrees or less. The material delivery devices may be rotatable about the energy emission device so that the material delivery devices may delivery material from virtually any location 360 degrees of the energy emission device. For example, the closed loop control may see that the melt pool is becoming too hot and one of the material delivery devices may be moved from a trailing region to a leading region to deliver the material to the desired location. The material delivery devices may vary the distance between the material and the electron beam. The distance of one material delivery device may be varied relative to a distance of another material delivery device. The distance of the material delivery device from the electron beam, the workpiece support, or both may be about 3 cm or more, about 5 cm or more, about 7 cm or more, about 10 cm or more, or about 15 cm or more. The distance of the material delivery device from the electron beam, the workpiece support, or both may be about 1 m or less, about 75 cm or less, about 50 cm or less, or about 25 cm or less. The distance may be varied in real time. The distance of one material delivery device may be varied independent of another material delivery device. The material delivery devices may provide the feedstock at the same rate or at a different rate. The material delivery devices may be connected to one or more positioning devices.

The raw material positioning device may be configured for orientating the position of the raw material feed relative to the energy emission device, preferably so that as raw material is advanced (e.g., continuously, intermittently, or both) by the material delivery device, the raw material is delivered into a path of energy emitted by the energy emission device (e.g., wire is fed into the path of an electron beam). The energy emission device, the wire feed device, or both, may be configured to translate over at least 3 axes of translation (e.g., over the x, y and z axes of a Cartesian coordinate system), and possibly even over 4, 5, or even 6 axes of translation. Thus, the raw material positioning mechanism may orientate the direction of the raw material feed relative to the energy source being emitted from the energy emission device, the molten pool, the work piece, or any combination thereof as the volume of the work piece increases.

The material delivery device may include a straightening mechanism, at least one feed motor, feed sensors, a raw material supply and/or containment unit, or any combination thereof. Power required to operate the raw material feed motors (drive and tensioning) of the material delivery device may be supplied from power via the at least one electrical feed-through discussed herein. Examples of welding wire supply and straightening devices are described in U.S. Pat. Nos. 4,898,317; 4,920,776; and U.S. Patent Application No. 20080296278, all incorporated by reference for all purposes. A suitable wire feed device thus may include a motor driven feeding mechanism including a pair of rollers that feeds a wire therebetween. As described in U.S. Patent Application No. 20080296278, incorporated by reference, optionally there may be a tension controller that adjusts a tension between at least one pair of rollers, a wire speed sensor that measures wire feed speed, and a control circuit that compares a driven speed of the wire with the feed speed of the wire. The tension controller may also adjust the tension between the rollers.

The raw materials used by the LM process may include one or a combination of alloys of metals (e.g., metals including a transition metal or an alloy thereof). Examples of raw materials that may be used are: titanium, aluminum, iron, nickel, chromium, (e.g., inconel), cobalt, stainless steel, niobium, tantalum, copper, bronze, brass, beryllium, copper, vanadium, or tungsten. Particular examples of materials useful in the present technology are titanium and alloys of titanium (e.g., also including aluminum, vanadium, or both), such as one including titanium in a major amount (or substantially the balance) and about 3-10 wt % Aluminum (Al) (more preferably about 6 wt %), and 0 to about 6 wt % Vanadium (V) (more preferably about 4 wt %)). The raw material may be supplied and/or fed in various shapes and sizes. In one preferred embodiment, the raw material is provided in the form of a wire feed stock. The raw materials may be provided in an already heat-treated (e.g., tempered) condition. It is also possible that the raw material may be provided in a powder material form, in which case, the material delivery device will be configured to include a suitable metering device for delivering a predetermined quantity of powder.

The material delivery device may be adjustable so that it is capable of feeding relatively large or even relatively small diameter wires (e.g., wires supplied by a wire spool, may have a diameter of about 5 mm or below, about 3 mm or below, or even about 1 mm or below) at both high and low speeds. The material delivery device may include one or more guide structures (e.g. one or more guide tubes) that help control wire position. The plurality of wires (of the same or different material type) may be fed from one or more material delivery devices, at one or more angles and/or distances from the molten pool deposit.

The LM apparatus includes an energy emission device that emits energy for melting the raw material to form a molten pool deposit, joining two or more substrates, adding material to a substrate, or a combination thereof. The energy emission device may be or may perform one or more of the welding techniques including: a laser, arc welder, plasma torch, joule welding, electron beam, friction welding, gas metal arc welding, gas tungsten arc welding, flux-cored arc welding, atomic hydrogen welding, gas tungsten-arc welding, plasma arc welding, electroslag welding, electric resisting welding, or a combination thereof. The energy emission device may be structurally supported in the chamber via a suitable structural attachment or positioning mechanism (e.g., arm), which may also carry the material delivery device. The energy emission device may be substantially located external of the chamber (e.g., 80% or more, about 85% or more or about 90% or more of the energy emission device). For example, the energy emission device may be mounted to an outside of the chamber and the electron beam may pass into the chamber from an external location. The energy emission device may include a head that extends into the chamber. The energy emission device may entirely be located inside of the chamber. One energy emission device may be used external of the chamber and a second energy emission device may be used inside of the chamber. For example, an energy emission device may be used to connect two substrates together before the substrates are placed within the chamber where a second energy emission device would apply material. The structural attachment or positioning mechanism may be adjustable. For example, the structural attachment or positioning mechanism may include one or more attachment features (e.g., fasteners or the like) that allow it to be secured in a fixed position and loosened or otherwise released for adjustment or re-positioning. The one or more attachment features may include a track or may be movable along a track. The positioning mechanism may be connected to or part of an articulating arm. The one or more attachment features may be movable or repositionable in real time, in conjunction with instructions from a controller, or both. The one or more attachment features may include or be connected to one or more motors. The emission device may be configured for orientating the position of the energy beam relative to the work piece and/or work piece support. It may have at least 3, 4, 5, or even 6 axes of translation (e.g., over at least the x, y, and z axes of a Cartesian coordinate system). For example, the energy emission device may be configured to move an electron beam gun using translation in X, Y, Z, tilt in one or more of the X-Y, X-Z, or Y-Z planes, or some other rotation to position the energy beam at a predetermined location relative to the work piece and/or the work piece support.

Power required to operate the energy emission device may be supplied from one or more suitable power sources. For example, power may be supplied via at least one electrical feed-through power supply. The power source may deliver power greater than about 10 kilowatts (kW) or even greater than about 30 kW. The power source may deliver power up to about 100 kW (e.g., up to about 50 kW). The energy emission device may be signally connected to one or more processor (e.g., a processor of a controller, a computer, or otherwise) for controlling the energy output from the power supply. The processor may be included in the closed loop electronic control device or may be part of a separate computer and/or controller, which is operated by the closed loop electronic control device.

A preferred energy emission device may include an electron beam generator that may focus a supply of electrons against the raw material (e.g., an electron beam gun). Upon contact with the raw material, the electrons may heat the raw material to cause the raw material to soften, vaporize, and/or melt, and thereby introduce the raw material into a molten deposit. The intensity of the energy emission device may be adjusted in real time. The energy emission device may weld materials together, melt materials, penetrate through one or more materials, heat and plastically deform a material, soften a material, or a combination thereof. For example, the energy emission device may generate an electron beam (which may be focused to a desired beam width or span). In another example, the energy emission device may weld two or more pieces of feedstock together or base substrates (e.g., two metal plates); the energy emission device may then be adjusted to melt a second feed stock so that the feedstock is liquefied to one or both of the metal plates (e.g., base substrates); and finally the energy emission device may be adjusted to heat the solidified second feedstock to smooth out the layers of the feed stock so that a near net part is created. The intensity may be varied by increasing or decreasing an applied voltage; adjusting a width of a beam; adjusting a duration a beam is maintained at a specific location; varying a raster pattern, pulsing the beam (e.g., turning the beam on and off); varying a distance the beam is from a feedstock, a part being formed, or both; varying an angle between the beam and a part being formed; or a combination thereof. For example, once the EBAM process is complete and all of the layers are formed so that a near net part is created, the electron beam may be used to smooth one or more external regions of the part so that visibility of the individual layers are reduced and/or eliminated. The energy emission device may soften one or more external regions of the part by any of the techniques discussed herein. The energy emission device may soften the material enough so that the material flows with gravity, but not liquefy the material. The energy emission device may liquefy the material so that the material flows. The energy emission device may be used to cut a base material, a plate, a part from a plate, or a combination thereof. The energy emission device may remove material by heating the material until the molten material flows from a location of interest. The electron beam may be achieved with a low accelerating voltage, preferably between about 3 kV to about 80 kV, more preferably about 10 to 60 kV, and even more preferably between 35 and 55 kV; with a maximum beam power in the range of up to about 10 to about 15 kW (e.g., about 3 to about 5 kW); by using about 100 V about 600 V (e.g., 110 V) input power; or any combination thereof. Preferably, the energy emission device may be operated so there is sufficient power density for the electron beam freeform fabrication process, while still providing suitable radiation shielding. The processes herein may operate the energy emission device within some or all of the above parameters.

One approach to the operation of an electron beam gun may be to maintain the parameters of the gun at a sufficient level so that the maximum depth of a molten pool deposit may be about 3 cm or less, more preferably about 1 cm or less, and possibly even about 0.5 cm or less. The beam may be operated in a generally defocused mode. For the deposition of a material, the beam may be rastered in a suitable pattern, such as generally non-circular pattern (e.g., an elliptical pattern, a linear pattern, a polygonal pattern, or any combination thereof). For example, a beam having a width of about 0.5 to about 0.8 mm may be rastered to cover an effective width (e.g., a width of about 1.0, 2.0, 3.0 mm, or larger or about 1 cm or 7 mm or less). In this manner, a relatively large amount of energy may be dispersed over a relatively large area, but to a relatively shallow depth, as compared with traditional electron beam welding. High speed deflection may be employed to control melting, control distribution of energy, to clean one or more components used to create a three-dimensional article, vaporize material, or a combination thereof. A high-speed deflection may prevent vapor contamination accumulation, contamination breaking loose and falling with a molten pool, preventing feed of raw material building up on any of the parts discussed herein; or a combination thereof. For example, metal vapor may land on a wire nozzle and intermittently (e.g., every second, every 10 minutes or more, 20 minutes or more, 30 minutes or more, 8 hours or less, 6 hours or less, or 4 hours or less) the energy emission device may pass over the nozzle to liquify, remove, or both the deposited metal vapor so that a large amount of material vapor is prevented from building up. The beam of the energy emission device may frequently scan across the nozzle tip to keep the nozzle tip clean. The beam may go across the nozzle tip 2 or more, 3 or more, 5 or more, or 10 times or more times every second. The dwell time of the beam on the nozzle may be about 1 micro second or more, about 5 micro second or more, about 10 micro seconds or more, about 50 micro seconds or more, about 500 micro seconds or less; or about 300 micro seconds or less. The one or more raster patterns employed may control thermal gradients within an article of manufacture, within a layer, at a melt pool, in a cross-section of a melt pool, or a combination thereof. The one or more raster patterns may be varied to affect granular structure or composition. For example, the cooling rate of an area of a part may be decreased so that material characteristics at that desired location are affected. The raster pattern employed may affect the chemistry of the article. The raster pattern may create convection mixing of the materials. For example, if the raster pattern is circles then the circular motion of the electron beam may create flow of molten material in a circular pattern such that mixing of zones may be created. Rastering may be used to change the microstructure, the composition, or both. For example, rastering may be used to vaporize one component so that the material composition changes. In another example, rastering may be used to reheat one or more components so that the microstructure of those components change or are changed upon cooling. The convection mixing may form homogeneous alloys. The selected raster pattern may vary the heat input into an article, a melt pool, feedstock, a zone that is cooling, or a combination thereof. The monitoring system may monitor one side of a melt pool relative to a second side of a melt pool. If a variation in temperature is measured from a first side to a second side the raster pattern may be adjusted to provide more energy to the first side or the second side so that the temperature gradient from a first side to a second side is substantially equal (e.g., 25° C. or less, 15° C. or less, or even 10° C. or less). The detector may convert pixels into a thermal image so that a temperature gradient may be monitored. The raster patterns may be circles, squares, rectangles, ovals, clover leafs, overlapping circles, figure eights, diamond, or a combination thereof. The raster pattern may account for cooling rates in to determine a shape of a raster pattern. For example, if one side of a melt pool is located next to a large article (e.g., a heat sink) and the second side is exposed then the side near the large article may be covered by a pattern more times so that the edges of the melt pool maintain a substantially equal temperature.

The processes also contemplates operating the energy emission device variably or constantly within some or all of the above parameters. For instance, in response to a detected condition, one or more of the above parameters may be varied by a signal sent from a closed loop control device as taught herein. By way of example, the operation of the energy emission device may be controlled in a suitable manner to achieve a preselected size for a deposited melt pool. The size of the deposited melt pool may be measured by the detector (e.g., metal melt pool deposits are controlled to maintain successively deposited layers so that the successively deposited layers exhibit a melt pool diameter or width of about 0.3 mm to about 20 mm or even about 0.5 mm to about 13 mm).

To the extent not taught expressly herein, or elsewhere herein, other art-disclosed operational parameters may be employed, such as are disclosed in U.S. Pat. No. 7,168,935, incorporated by reference (see, e.g., cols. 5, 9, and the claims). Other art disclosed energy emission devices may be employed alone or in combination with an electron beam gun, such as a laser.

The LM apparatus may include a work piece support upon which a work piece may be formed layer by layer from a plurality of successively deposited molten pool deposits, and which may provide a suitable conductive path of the electron beam (when on) in order to help avoid static build-up. Preferably, one or more base substrates are provided on the work piece support and the plurality of successively deposited molten pool deposits are applied on one or both of the one or more base substrates and the one or more base substrates become an integral piece of a completed part. The work piece support may include a positioning mechanism (e.g., a stepper motor, a servo motor, or some other motor) for moving the work piece support while optionally allowing the energy emission device or another component to remain stationary. The work piece support may be maintained generally stationary while moving the energy emission device or another component. The work piece support may further include at least one positioning sensor (e.g., rate and location sensors); at least one positioning motor; one or more power lines; or any combination thereof. The work piece support may translate over at least 3 axes of translation (e.g., over the x, y, and z axes of a Cartesian coordinate system), more preferably translates linearly and rotationally over a total of at least four, five, or even six axes (e.g., at least the X, Y, and Z axes). The work piece support may rotate, clockwise, counterclockwise, or both around any of the axes. The work piece support may be located parallel to a bottom of the chamber. The work piece support may be located perpendicular to a bottom of the chamber. The work piece support may include a first side and a second side with a rotation frame located therebetween. The work piece support may be capable of moving entirely or partially outside of the chamber. The work piece supports may be connected to or include a rotation device.

The rotation device may connect to one or more base substrates and rotate the one or more base substrates so that material may be applied to a first side and a second side of the one or more base substrates. The rotation device may connect to two or more base substrates so that material may be applied to a first side or second side of a first base substrate and a first side or second side of a second base substrate. The rotation device may include two or more work piece supports. The rotation device may include a rotation frame.

The one or more rotation frames may function to connect to one or more and preferably two or more base substrates so that the base substrates are rotatable from a first side to a second side. The rotational frames may attach to one or more base substrates so that as material is added to a first base substrate and a second base substrate material may be added to both base substrates. The rotation frame may assist in connecting a first base substrate to a second base substrate. The rotation frame may only rotate two or more base substrates. The rotation frames may have a rotational axis that extends parallel to a base of the chamber, perpendicular to the chamber, or an angle therebetween. The rotational frame may hold two or more connected base substrates in a position so that an energy emission device may provide material onto each of the two or more base substrates. The rotation frame may include one or more longitudinal bars, one or more connection bars, and one or more clamps. The rotational frame preferably includes two or more longitudinal bars, two or more connection bars, and a plurality of clamps.

The one or more longitudinal bars and preferably the two or more longitudinal bars function to support one or more base substrates and preferably two or more base substrates. The longitudinal supports may include one or more clamps that connect to the base substrates. The longitudinal supports may extend between two or more connection bars. The longitudinal bars may be free of any clamps. The longitudinal bars may be directly connected to the rotation device, the work piece support, or both. The one or more longitudinal bars may be two longitudinal bars that located adjacent to one another and extend generally parallel to each other. The longitudinal bars may be movable along one or more connection bars. The longitudinal bars may be movable towards or away from one another. The longitudinal bars may extend parallel to the rotational axis. The longitudinal bars may connect to connection bars along end regions of each of the longitudinal bars. The work piece supports may be movable towards and away from each other and the longitudinal bars may move relative to the connection bars.

The one or more connection bars may connect an end of one or more longitudinal bars to a work piece support. Each work piece support may include one or more connection bars. The one or more connection bars may connect the longitudinal bars, the base substrate, or both of the work piece support. The one or more connection bars may connect directly to one or more base substrates. The one or more connection bars may include one or more clamps. The one or more connection bars may include a plurality of clamps. The one or more connection bars may be free of clamps. The clamps may be pneumatically operated, hydraulically operated, manually operated, operated by a motor, threaded, include a lever, include a knob, or a combination thereof. The one or more clamps may include one or more teeth, gripping surfaces, a smooth area, or a combination thereof.

The one or more clamps may connect one or more base substrates to the rotation frame. The one or more clamps may hold two or more base substrates together without any other joining material or techniques. The one or more clamps may connect to one or more base substrates so that the base substrates may be rotated.

Layer manufacturing according to the present teachings may orient an energy beam (e.g., an electron beam) vector substantially normal to the surface on which the deposit is being built. This tilt capability (e.g., positioning mechanism) enables positioning of the work piece support at different angles from 0° (platform normal is parallel to the energy beam vector) to 90° (platform normal is perpendicular to the energy beam vector) to allow enhanced flexibility and capability to build complex geometries, which may include undercuts, overhangs, hollow sections, or any combination thereof. The platform may tilt by about 5 degrees or more, about 10 degrees or more, or about 15 degrees or more in any direction. The platform may tilt by about 90 degrees or less, about 75 degrees or less, or about 60 degrees or less. As can be appreciated using traditional manufacturing techniques this has been difficult to fabricate without expensive tooling, coring operations, and/or secondary processing (e.g., machining). The secondary operations may be heat treatment, cold work, hot work, thermomechanical processing, machining, forging, selectively deforming, one or more coining cutting, metal working, increasing temperatures, decreasing temperatures; residual stress removed, or a combination thereof. The secondary operations may be performed at a temperature for inducing stress relief. The secondary operation may have the electron beam introduce heat into the part without melting the part. The secondary operation may reduce stress by heating to prevent warping. The secondary operation may split the beam, raster the beam, defocus the beam, or a combination thereof to heat the part without melting so that the part is destressed, warping is prevented, the stresses are balanced, or a combination thereof. The secondary operation may be annealing. The secondary operations may be hot forging followed by hardening (e.g., precipitation hardening). Forging may include drawing (e.g. increasing length and decreasing a cross-section), upsetting (decreasing length and increasing a cross-section); squeezing (e.g., in multi-directional); or a combination thereof.

The LM apparatus may include one or more monitoring systems that may include a detector, (e.g. an optical detector or more preferably a camera such as a digital camera), for monitoring a preselected condition. Preferably, for monitoring a preselected condition of deposited materials. More particularly, for monitoring a molten pool of the deposited materials. The monitoring system or its components (e.g., detector) may be located at least partially within the chamber. The monitoring system may have a detector with a detector housing (which may be temperature controlled), and an optional vapor protector.

The detector may include one or more sensors or other devices (e.g., one that derives its measurements optically, mechanically, by infrared imagery, by some other radiation detection, or otherwise). The detector may be a solid-state device such as one that comprises one or more sensors (e.g., a solid-state array effectively including a plurality of sensing pixels) that convert a detected condition into an electrical signal.

The detector may be used so that the detector monitors a condition associated with a molten pool deposit. The detector may monitor bulk average temperature of the molten pool deposit, temperature gradient within the molten pool deposit, surface topography of the molten pool deposit, the presence of any liquid-solid interface in the molten pool deposit, surface profile of the molten pool deposit, chemical analysis of the molten pool deposit, or any combination thereof. For example, the detector may be configured to measure the melt-pool energy of the molten pool, which may be determined by measuring the melt-pool size and temperature using an optical technique (e.g., by use of a suitable imaging device such as a camera). The detector may monitor a temperature of the work piece so that the work piece may be softened but not melted. The detector may monitor the position (e.g., distance, orientation, angle) of a feedstock relative to the energy emission device, a beam from the energy emission device, a melt pool, the work piece, the base substrate, or a combination thereof. A preferred detector may employ suitable hardware adapted for machine vision applications, and thus may include one or more housing (e.g., temperature regulated housings). The housing may contain a suitable substrate that includes an array of pixels, and optionally one or more lenses and/or shutters for controlling optical communication between the pixel array and the object being monitored (e.g., a molten pool of a work piece).

The detector may include a camera selected from a high-speed video camera, standard video cameras, thermal imaging cameras, still imaging cameras, or any combination thereof. The detector optionally may include one or more of the following, an accelerometer, a thermocouple, a pressure sensor, a current sensor, a voltage sensor, a deflection coil sensor, a focusing coil sensor, a rate sensor, a location sensor, a wire feed subsystem sensor, a laser, infrared sensor, or a combination thereof. An example of a suitable detector may be a camera (e.g., a high-speed camera) with an image sensor that includes one or more of the following features: an array of active pixels (e.g., a complementary metal oxide semiconductor (CMOS) image sensor array, a charge coupled device (CCD) image sensor array, or both); progressive scan; resolution that is at least about 640×480; preferably at least about 752×582; and more preferably at least about 1024×1024 pixels. Examples of art-disclosed CMOS imaging systems are found in U.S. Pat. Nos. 6,815,685; 7,107,118; and 7,380,697, all of which are incorporated by reference herein. The detector may display results monochromatically, in color, or both. The detector may be configured so that it operates at an image acquisition rate or frame rate that ranges from about on the order of at least about 25 frames per second, e.g., about 30 frames per second (fps) or higher. The detector may operate at least at about 40 fps, at least at about 50 fps, or even at about 60 fps, or more. For example, it may operate at about 25 to about 500 fps (e.g., about 30 to about 60 images per second, about 150 fps, or faster). Suitable sensor arrays for detectors may have a pixel size of about 9×9 $\mu m^2$ to about 12 x12 $\mu m^2$ (e.g., about 10.6×10.6 $\mu m^2$).

Suitable cameras may include a CMOS active pixel image sensor, CCD image sensor, or both, preferably housed together with suitable optics and associated electronics. Examples of preferred cameras are available from Photon Focus of Switzerland (e.g., sold under model number MV-D1024E-40-CL-12, MV-D752-28-CL-10, or MV-D1024E-160). An example of a preferred camera may include a dynamic range with a relatively high contrast resolution (e.g. at least about 80 dB, 120 dB, 140 dB, or more), and a shutter and/or an electronic shutter (e.g. a shutter that controls exposure time electronically (i.e., allows the camera to collect light for a finite amount of time) without any mechanical or moving parts) that may be used for high speed applications with an exposure time of about 5 to about 1000 μs (e.g., about 10 μs). A camera may employ a suitable imaging array as is employed conventionally for monitoring welding conditions. The camera may have a skimming feature. The imaging sensor may operate over a spectral range of about 200 to about 1200 nm (e.g. about 350-1000 nm). In addition to a camera, the detector may include one or more lasers.

The one or more lasers may function to determine a distance, a position between two objects, a height of an object (e.g., z-direction), a width of an object, a height of a piece, or a combination thereof. The one or more lasers may scan a work piece. The one or more lasers may transmit a constant beam so that a height of material being added is continuously measured. Based upon measurements from the one or more lasers speed of the electron beam deposition process may be varied to increase or decrease an amount of material being added to a work piece. The one or more lasers may be located substantially overhead a melt pool. The one or more lasers may be located perpendicular to a melt pool. The one or more lasers may be located on an articulating arm that may move and monitor a plurality of different locations of the work piece from a plurality of different angles and positions. In addition to one or more lasers or in lieu of a laser the monitoring system may include one or more spectrophotometers, electromagnetic acoustic transducers (EMAT), laser pulse, laser scan, backscatter detection, secondary emission detection, or a combination thereof.

The real-time detection may function to monitor deposition by way of one or more sensors to detect for potential process anomalies such as porosity, chemistry defects, lack of fusion, or a combination thereof so that if detected the potential process anomalies are detected in real time and the process may be varied based upon the detected conditions. The real-time detection may allow for a second sweep of the electron beam to cure the defects. The real-time detection may allow for additional melting, material, heating, or a combination thereof to be applied to a location of interest. The real-time detection may follow behind the electron beam and scan each layer as the layer is placed. The real-time detection may be able to scan 1 or more layers deep, 2 or more layers deep, or 3 or more layers deep. The real-time detection may be able to detect if defects are present or if a layer is approaching being out of tolerance. The real-time detection may alter one or more functions of the energy emission device in order to cure a defect of a layer or bring the layers within a center of a tolerance. For example, if a pore is found, the beam may pass over the pore so that the pore is collapsed. The real-time detection may be a non-destructive quality control. The real-time detection may include a spectrophotometer that monitors plumes of vapor or plasma created when the electron beam contacts feedstock, a layer, a melt pool, or a combination thereof. The spectrophotometer may determine the metal vapors present in the plume of smoke and adjust the raster pattern, beam intensity, dwell duration, or a combination thereof. For example, if it is found that the plume includes a large amount of aluminum then the beam intensity may be decreased so that less aluminum is vaporized. In addition to non-destructive testing the real-time detection may monitor z-height of an article.

The z-height detection may function to monitor a height a part but preferably to monitor a height of each layer. Z-height detection may be determined with a laser, a camera, backscatter, or a combination thereof. The z-height may be monitored from an angle relative to the z-direction. Preferably, the z-height is monitored from a location perpendicular to the z-direction. The detector may be side mounted. The z-height detector may detect when the beam is off. The z-height detector may detect when the electron beam is on. The z-height may be calculated by comparing data gathered from substantially overhead to a camera at a second angle. The overhead mounting system may be able to calculate z-direction without a second camera or detector.

A monitoring system includes a detector with intermediate optics that allow images to be captured substantially overhead of the melt pool deposits. For example, the detector may face a reflective substrate (e.g., a mirror or other suitable member that reflects an image) that may be positioned between the detector and the object to be imaged (e.g. a weld pool). The reflective substrate may be positioned so that the detector has a line of focus (e.g. a path from the detector to the reflective substrate) that may be approaching generally perpendicular to the electron beam, and the reflective substrate may have a line of focus (e.g., from a pinhole of a purge block to the imaged structure) that is positioned generally in alignment with the path of the electron beam.

The light beam and the energy beam may have an orientation relative to each other. Preferably, the light beam and the energy beam are substantially parallel (e.g., within about 5 degrees or less, about 3 degrees or less, or about 1 degree or less). The energy beam being directed from the energy emission device extends along an axis, which may be generally perpendicular (e.g., about 90°) or normal relative to the work piece support or if the beam is moved from being perpendicular then the light beam is moved with the energy beam. The positioning mechanism of the monitoring system may position the vapor protection device so that the light beam may be received by the vapor protection device extends along an axis, which may be at an angle from about 0.05° to about 20° (e.g., about 2° to about 10° and more preferably about 6°) from axis of the energy emission device (e.g., the beam). Thus, the angle may be about 20° or less or even about 10° or less. In one preferred embodiment, the light beam generally deflects at about a 90° angle from being received by the reflective substrate to being deflected to the detector.

The detector may be used in any step of monitoring, which may include capturing an electronically stored image substantially in real-time (e.g., it is less than 5, 4, 3, 2, 1 or, lower, seconds from the time of the event recorded). The sensing device may detect electromagnetic radiation emitted from interaction of the energy beam (e.g., electron beam) with a material in the work piece (it being recognized that the work piece will include any present molten deposit) to be imaged.

Detection according to the present teachings may be for purposes of directly obtaining a measurement that is indicative of a condition of a pool deposit. A detection technique may be employed that indirectly measures a condition of a pool deposit by observing a detectable characteristic, and then correlating the detected characteristic with an indication of a particular condition. To illustrate, under this approach, oscillation frequency of a pool deposit may be monitored, and may be correlated with a depth of a deposition pool, it being theorized that a higher detected frequency may indicate less penetration of a molten pool deposit into a previous deposition layer. The shape of the melt pool may be generally round and generally axially symmetrical. The melt pool may include a generally C-shaped portion with a generally circular or elliptical shaped portion (which may correspond to an image of the feed material) that is within the C-shaped portion, and possibly extending outside the opening of the C-shaped portion. Adjustments may be automatically made to the system so that a predetermined shape for the image is obtained, a generally axial symmetry is achieved, or both.

The LM apparatus may include a housing that defines a chamber wherein the work piece may be formed. The housing preferably may form a sealed chamber capable of maintaining an evacuated environment. The major components of the LM apparatus may be contained within the sealed housing (e.g., the material delivery device, the energy emission device, the work piece support, and the detector). The housing may include one or more chambers. The housing may include a main chamber that the energy emission device is located within and adjacent chambers that house one or more of the other components. For example a spool of wire may be located within an adjacent chamber so that the spool is protected from becoming dirty or contaminated, but both chambers may be maintained in vacuum. The spool may be located in a separate vacuum chamber or adjacent chamber that is connected to a main chamber. The separate vacuum chamber may include its own vacuum pump. Stopping operation while a spool is changed. Switching from a spool in a first adjacent chamber to a spool in a second adjacent chamber so that operation does not need to be stopped. The spool may be changed without breaking vacuum on the main chamber. The spool may be changed and a wire may be fed into the material delivery device by a feeder guide that extends through the wall of the main chamber. The spool may be changed using one or more of the following steps. Connecting one or more adjacent chambers to the main chamber. A membrane may be located between the main chamber and the one or more adjacent chambers to permit material to pass through a wall but restrict airflow between the chambers when material is passing through the wall. The seal may be formed by a gate valve, a butterfly valve, globe valve, ball valve, a movable wall, a rotatable wall, or a combination thereof. Opening a separate chamber (e.g., adjacent chamber). Sealing an interface between a main chamber and a separate chamber. Shutting of a secondary vacuum pump. Breaking vacuum of a separate chamber. Removing an empty spool or reel. Placing a new reel or spool on a feed location. Feeding the wire into a feeder guide. Closing a separate chamber. Turning a vacuum pump on. Creating a vacuum in the adjacent chamber. Comparing the vacuum in the adjacent chamber to the vacuum in the main chamber. Removing a seal at an interface between the main chamber and the separate chamber. Resuming operation of EBAM. The energy emission device may be located outside of the main chamber, but extend through a wall of the chamber. The adjacent chambers may provide for modularity of the LM apparatus. The adjacent chambers may allow for the main chamber to be increased or decreased in size depending upon the size of the component being created. The adjacent chambers may allow for components to be added when the LM apparatus is being used for EBAM and removed or closed off when the LM apparatus is being used for Electron Beam Welding (EBW). The modularity of the chamber may be suited for providing a smaller system or a scalable system. The modularity may allow for new components to be added as they are developed without the need for reconfiguring the chamber, adding additional carriers, or both. An entire closed loop control system may be located inside of the chamber or outside of the chamber.

The housing may include a frame and at least one wall formed of a material. The wall may be made of ceramic, a ceramic composite, a metal matrix composite, a polymer matrix composite, or a combination thereof. The frame and at least one wall may be made of titanium, aluminum, aluminum alloys, beryllium alloys, stainless steel, steel, or a combination thereof, which may provide for radiation protection and structural integrity. The housing may further include at least one window for operator visibility as well as monitoring by cameras or a video system. It should be recognized that, even though the present teachings obviates human operator intervention, the processes and apparatus here may be practiced with some human operator intervention; however, any such intervention may be considerably less than prior systems, and may be aided by real time data acquisition from the monitoring system.

The at least one window may be formed of a transparent material such as leaded glass, glass, transparent plastic, or any combination thereof. The housing may include at least one door attached to the frame or wall to allow full access to the chamber's interior, when not under vacuum. The sealed housing includes at least one electrical and/or data cord feed-through for connecting the material delivery device; the energy emission device; the monitoring system (e.g., detector); motors for positioning mechanisms (e.g., for the material delivery device, energy emission device, monitoring system, the work piece support, or otherwise); or any combination thereof, with a power source and/or instrumentation (e.g. computer system) located outside the housing.

The housing may be a generally larger rectilinear cross-sectional shape. However, other shapes and sizes are possible. The sealed chamber may be generally small so that the housing may be portable. As discussed above, the housing provides a sealed chamber that may be evacuated using a vacuum mechanism (not shown) to reduce the pressure of the chamber below atmospheric pressure. For example, a pump, blower, some other fluid mover, or a combination thereof may be used to reduce the pressure within the chamber. The pressure within the chamber may range from about $1\times10^{-1}$ to about $1\times10^{-7}$ torr (or possibly lower). Furthermore, the pressure within the chamber may be less than about 0.1 torr, preferably less than about $1\times10^{-2}$ torr, and more preferably less than about $1\times10^{-4}$ torr.

The effectiveness of the above described detectors and monitoring steps may be dependent upon assuring a clear line of sight between the sensing elements of the detector and the object being measured (or any intermediate optical elements, such as mirrors (e.g., one or more mirrors that may be used for beam modulation)). However, the process and/or apparatus may generate raw material vapor that may be susceptible to deposition onto hardware associated with the detector. For example, vapor may deposit upon a lens of the system, and/or upon another optical element (e.g. a mirror).

The apparatus may include a suitable vapor protection device, which functions to impose a protective barrier (e.g., a solid barrier, a fluid barrier, or both) forward of one or more of the vulnerable exposed components. Preferably, the vapor protection device will be such that the vapor protection device resists vapor disposition build-up onto the exposed componentry so that the vapor does not build up and adversely affect measurement integrity. The vapor protector device may include one or any combination of a relatively low surface energy coating (which may be substantially transparent to the radiation being detected) that delays vapor deposition build-up onto a surface as compared with a surface without the coating; a solid physical barrier (e.g., a shutter, a curtain, or other barrier that can be opened and closed to expose the componentry as desired); a fluidic barrier (e.g., a gas stream that can be controllably flowed to expose the componentry as desired); or a combination thereof.

A vapor protector device may be located substantially adjacent to a barrier with an aperture that may have an optical element located behind the wall (e.g., a beam modulation aperture). A vapor protection device may be positioned substantially adjacent with the detector (e.g., proximate to the lens of a camera), remote from the detector (e.g., proximate to a reflective substrate, but laterally spaced apart from it), or both. The barrier with an aperture may be located juxtaposed the second opening of the housing. The protective device may include a protective means, for reducing or eliminating vapor buildup, such as a purge system. The purge system may include a purge line (not shown) attached to a fitting, and a port so that the fitting and purge line may be connected to the vapor protection device for delivering a fluid into the housing. The fitting may be a compression fitting and may attach to a tube or a pipe. The fitting may be positioned proximate to the barrier with an aperture so that a fluid stream may enter through an intake port and may be directed towards (e.g., laterally) the opening of the barrier in a. The gas stream may exit through an exhaust port.

The vapor protector device may be operated in an intermittent manner, allowing periodic direct line-of-sight exposure (via one or more pin-hole apertures) of the detector to the object being sensed. The fluid may be generally optically transparent, thereby allowing an image to be received through the aperture. For example, periodic bursts of a fluid (e.g., a substantially inert gas such as helium) may be blown to effectively blanket the pinhole aperture. In this manner, it may be possible to clear vapor away from exposed componentry. The vapor protector device, preferably, may be operated in a continuous manner. For example, one or more pumps (i.e. a vacuum pump) may be used to create a periodic and/or continuous flow of the fluid that exits through the pinhole aperture, and may generate a positive pressure inside of the vapor protector device. The one or more pumps may be operated so that the pumps are not overwhelmed while still maintaining the flow of the fluid at a constant rate and pressure such that the vapor particles are prevented from building up on the internal surfaces of the vapor protector device. The pumps may be controlled by the closed loop control system that operates the various components herein or independent of such system.

The monitoring system may include a barrier with an aperture (e.g., what is regarded herein as a pin-hole aperture). For example, the pin-hole aperture may be an aperture having a diameter or width (e.g., circular, oval, slit, or otherwise) of about 0.50 mm or greater, of about 2.0 mm or greater, of about 3.0 mm or greater, or even about 5.0 mm or greater) and any associated optics. Other components of the vapor protection device may also include a pin-hole aperture, which may be axially aligned with the pin-hole aperture of the barrier along an axis. The barrier with an aperture may be, for example, an optical aperture, a standard aperture, or both for controlling the diameter of a beam from a light source (e.g., for modulating the beam by limiting the light admitted therethrough), producing optimal diffraction patterns, or both, preferably during the course of detecting by the detector. For example, a barrier with an aperture of a various size (e.g., adjustable) or a constant size, where size (e.g., diameter) may be determined from the equation:

$$D^2 = (K\lambda ab)/(a+b);$$

D=Diameter of the opening (e.g., pin hole) (e.g., about 0.076 mm)

K=Constant between 1 and 4 (e.g., about 3.24)

A=Wavelength of the light (e.g., about 660 nm)

a=Distance from the subject (e.g., work piece such as the molten pool deposit) to the opening (e.g., about 330 mm)

b=Distance from the opening to the image plane (e.g., deflector such as the mirror) (e.g., about 12.7 mm)

One or more suitable conduits may be employed for supplying the fluid. The one or more suitable conduits may be housed separate or independent from the components of the detector. For example, the one or more suitable conduits may be independent of (e.g., not attached directly) the detector housing (e.g., a camera housing). Rather, the vapor protection device and the housing (though possibly carried by a common structure) may not be commonly enclosed with each other. Thus, the vapor protection device may be longitudinally separated from the detector housing (e.g., camera housing), and one or more suitable conduits may be connected directly to the vapor protection device but not the housing.

The monitoring system may include a suitable structure that allows the sensing device of the detector to be oriented away from the direct line of sight with an object being monitored, but which still captures an image substantially overhead of the melt pool deposit. In this case, it may be possible to employ a reflective substrate such as a mirror (e.g., flat, concave, or convex), more particularly a silver mirror available from Edmund Optics. The reflective substrate may be configured to deflect light according to an indirect path from the work piece (e.g., molten pool or otherwise) to the detector. The vapor protection device may further include a reflective substrate adjustment knob (e.g. a threaded device that connects adjoining pieces and is translatable to adjust/position the adjoining pieces relative to each other) so that the reflective substrate may be kept in the direct line of sight with the object being monitored. The reflective substrate is substantially resistant to image distortion when subjected to operating conditions of the system. For example, the reflective substrate may exhibit a relatively low thermal expansion, e.g., within about $+/-0.10\times10^{-6}$ per ° C.

The reflective substrate may be mounted in a housing. The housing may create a line of sight to the reflective substrate. The line of sight may be an angle between about 0 and about 180 degrees, more particularly between about 30 and about 150 degrees, and even more particularly between about 60 and about 120 degrees (e.g., about 90 degrees) between the line of focus from the detector to the reflective substrate and the line of focus from the substrate to the image.

The housing (e.g., a 16 mm, right angle, kinematic mount) may be a generally sealed unit so that contamination and/or vapor deposition buildup may be substantially reduced or eliminated. The reflective substrate may be generally sealed within a housing having at least two openings with a first opening for receiving the beam of light from a predetermined location (e.g., the work piece, the work piece support, or otherwise) and a second opening for reflecting the beam of light to the detector. The first opening and second opening may include a generally transparent substrate or otherwise for allowing the light beam to be directed through the housing while generally maintaining a sealed environment. More particularly, the generally transparent substrate may be a glass window (e.g. a glass window or a borofloat glass optical window) or a lens (e.g. an Esco Doublet #A912150). The transparent substrate may be a component of the detector or may be separate therefrom. The transparent substrate may be held in place by one or more retaining ring. In one preferred embodiment, the transparent substrate may include a resistant material (e.g., coating) that substantially prevents or eliminates vapor disposition buildup. The resistant material may exhibit one or more of the following characteristics: a low coefficient of expansion, visibility to near infrared transmissions, a high resistance to thermal shock, chemical resistance, an anti-reflection, or any combination thereof. The resistant material may include borosilicate.

The detector or any of its sensing devices may be partially or completely encased in a detector housing, which may be thermally regulated so that the temperature of the detector or its components may be controlled (e.g., for cooling its electronic components). There may be a suitable support member (e.g., a flange) for supporting the housing relative to the support base. The monitoring system may be attached to the housing of the energy emission device using an attachment structure (e.g., a flange). For example, as depicted there is a support base from which a mount wall projects away (e.g., upward). The support base and the mount wall may be substantially perpendicular to each other. At one end of the attachment structure, such as at an end of the support wall there may be a mechanism (e.g., a fastener) for removable attachment. Attached to the mounting wall may be one or more rotational mounts. The support base may include one or more adjustment mechanism that allow axial translation. For example, the support base may include two opposing members that are slidable relative to each other, but provide opposing support surfaces. An example may include a dovetail adjustment structure. The support base may be attached to a common carrier with the energy emission device. The monitoring system may be secured to the energy emission device so that at least a portion of the monitoring system (e.g., the vapor protection device) may be positioned within the housing of the energy emission device, or at least substantially adjacent to the part of any emitted beam.

The monitoring system may further include one or more lens tubes extending between the detector and the vapor detection device. A lens tube may be configured to isolate the light beam associated with an image from the surroundings. The lens tubes may include one or more transparent substrates (e.g., a lens) that may be held in the lens tube using one or more retaining rings. The lens tube may be spaced apart from and is not housed with the reflective substrate of the vapor protection device.

The monitoring system may further include one or more support members and (e.g., elongated members such as rail carriers, a cage system, or a cage structure) to provide connecting support for the detector, the lens tube, the vapor protection device, or any combination thereof. The cage system may be created by the one or more support members and may have no overlying housing. Thus, the vapor protective device and the camera may be separated by an open cage structure. A plurality of elongated support members may be telescopically connected to each other for allowing lateral translation and adjustment, longitudinal translation and adjustment, or both. The support members may be configured so that they allow the detector to receive an image from the reflective substrate, while protecting the monitoring system. The support members may allow for a generally linear path through the lens tube to the reflective substrate. The monitoring system may include an adjustment mechanism (e.g. an axially translatable mechanism) to adjust the position of components of the optical system (e.g., the vapor protection device (e.g., linearly towards or away from the detector)). The support members may further be configured to provide axial adjustments. In this manner, a fluid line may be maintained separately from the detector (and particularly a temperature controlled housing) and can be manipulated without disturbing the detector. Though the vapor protection device and the cooled camera housing may be carried on a common support structure, the vapor protection device may be decoupled from the cooled camera housing.

The LM apparatus may include one or more cooling mechanisms such as a heat sink to absorb and dissipate heat in regions where heat build-up is expected. For example, the detector may further include a water cooled housing (e.g., within the camera housing) with a direct chip level heat sink to generally maintain the detector within normal operating conditions.

In general, such a cooled camera housing may include a housing that surrounds electronic components (e.g., at least one printed circuit board) associated with the detector (e.g., electronic components of a camera). The housing preferably includes a passage defined in at least one wall through which a heat exchange medium (e.g., a suitable liquid coolant) is flowed. Desirably, the heat exchange medium is passed through a wall at a location between any beam from the energy emission device (e.g., an electron beam from an electron beam gun) and the electronic components). By way of example, the cooled housing may include a plurality of stacked flanges, at least one of which has a passage at least partially laterally defined therein through which the heat exchange medium is flowed. Some or all of the flanges may define a generally ring shaped peripheral portion that surrounds at least one through hole that defines a cavity. The flanges may be configured to include one or more support surfaces, brackets, or other structures to which a component (e.g., an electronic component) may be mounted or otherwise supported. The flanges may adjoin each other and be separated by a relatively resilient but thermally conductive layer, and particularly a polymeric (e.g., acrylic based) spacer pad.

A cooled housing may include a plurality of flanges, and more preferably at least three axially aligned flanges that may be separated by spacers. At least one cavity may be defined within the assembled flanges, within which at least one electronic component is housed, such as one or more printed circuit boards. An image detector (such as an array of pixel sensors may also be contained therein, and be in at least temporary visual communication with an object to be imaged. At least one flange (e.g., a front flange) may include an inlet and an outlet so that a fluid may be circulated through the front flange (e.g., at least across the length or width of the flange). The front flange may further include a mount adapter (which may be located in a central region of the front flange) that enables mounting of the associated hardware to the housing. The flanges may be assembled together and connected such as by way of a plurality of suitable fasteners. Two or more of the internal components may be connected to each other in signaling communication. The rear flange may include suitable structure configured to afford connection of powered components with a suitable energy source, or through which cables or other signal lines may be passed. The housing may have a generally rectangular cross sectional outer profile along the longitudinal direction of the housing, other shapes are also possible. The housing may be longitudinally spaced apart from the vapor protection device described herein, and may not share a common enclosure with the vapor protection device. Thus, any pinhole aperture for resisting vapor buildup and associated with mirror or other reflective optics may be housed in a separate enclosure. The housing may be free of any line or other conduit for supplying a gas to the vapor protection device; thus, the housing may be free of any fluid (e.g., gas) that passes through it for resisting vapor build-up.

As discussed the image detector may be any type of device for imaging the inside of a chamber (i.e. infrared video camera, television camera, CCD, or the like). As discussed, one preferred detector uses a CMOS array. The housing may be free of air circulation. However, air may be circulated through the housing, the circulated air may be conditioned, or the circulated air may be an inert gas. The camera may be placed in the housing so that the camera is cooled; preferably the housing may be a part of the camera so that the housing protects and cools the components.

The LM apparatus further may include a closed loop electronic control device for controlling operation of one or more components of the LM apparatus in response to a condition detected by the detector. One or more of the controls (e.g., closed loop control device) and data acquisition may be electronically managed through a user interface and display device (e.g., suitable instrumentation, such as one or more computers). The closed loop electronic control device may operate to perform one or any combination of functions. Most generally, the closed loop electronic control device may acquire one or more signals obtained by the detector (e.g., in real-time, as the detector or any sensing device is monitoring the work piece). The closed loop electronic control device may process the signal by comparing the signal with a stored value (e.g., a value that is programmed into a database, a value from a previous reading, or both). Based upon the step of comparing, the closed loop electronic control device may issue a command that may cause the processing parameters to be changed to one or more different processing parameters (e.g., the closed loop electronic control includes a processor that is programmed to perform the comparison and then issue a certain signal based upon the results of the comparison). For example, the closed loop electronic control device may issue signals to one or more of the following: the material delivery device, the energy emission device, the work piece support, the detector, an electrical supply, a vacuum device, a gas supply, the vapor protector, or a combination thereof. The command from the closed loop electronic control device may cause the alteration of one or more conditions, as have been described previously. The conditions that may be altered may be one or more of the following: the location of any device for supplying energy to melt the raw material; the location of any device used for feeding the raw material; the location of any platform upon which a work piece is built; the pressure of any environment in which the processing is performed; the temperature of any environment in which the processing is performed; the voltage supplied to melt the raw material; the beam used for any electron beam source of energy for melting the raw material; the feed rate of the raw material, the composition of the deposited material; changing the temperature of the work piece; the temperature of the platform; or any combination thereof. Examples of suitable software that may be used for the programming of devices used in the present teachings include software available from National Instruments (Austin, TX) under the designation NI Developer Suite (including LabVIEW PDS, LabWindows/CVI, Measurement Studio, SignalExpress, LabVIEW and LabWindows, and optionally Image Acquisition) and Machine Vision Option for NI DevSuite (includes Vision Development Module, Vision Builder for Automated Inspection, and Vision Builder for AI Development Kit).

The control device may include machine control and process control functions. An example of a suitable commercially available control system is available from Sciaky Inc., under the designation W20XX. The control system may include a suitable computer control and interface (which may include one or more micro-computers, servo drive modules, input/output modules, or signal conditioning module). The control system may include one or more suitable processors (e.g., a processor with at least one VME or other standard bus back plane), such as the 680X0 series of processors (e.g., 68040) from Motorola, with the processors including on-board memory (e.g., Random Access Memory (RAM)). More preferably, an Intel® Pentium® processor may be used. The control system may include a user interface component (e.g., suitable input/output hardware that communicates with the processor and allows programming of the processor, such as by a Microsoft Windows™ operating systems, or otherwise). The control system may include suitable software (e.g., software available under the designation Sciaky Weld 20XX (e.g. W2000, W2010, W2020) or some other W20 family of software).

The W20XX control system may be in signaling communication with one or more suitable computer (e.g., T7400 Workstation PC, by Dell) that may be used to perform closed loop parameter adjustments sent to operate the overall system (e.g., a power supply (which may include a solid-state power supply), an electron beam gun, any detector or sensing device, any data acquisition electronics, or otherwise)). The control system may be in signaling communication with hardware, such as an energy emission device, a monitor, a work piece support, other hardware that is controllable according to the present teachings, or a combination thereof.

Thus, the computer application software, computer system, and the closed loop electronic control device, or a combination thereof may be in communication with the detector so that process parameters may be monitored as previously discussed herein and controlled.

Controlling may be based upon a detected shape of a melt pool deposit. For example, a detected shape may cause the control system to change a processing condition such as one that affects melt pool surface tension, a feed condition, or both. Surface tension may be a characteristic that is detected and upon which adjustments to processing conditions are made.

The control device may include a Linear PID (proportional-integral-derivative) style of control. The control device may be a single input single output system. The control device may include a multi-input/multi-output (MIMO) routine which may have a variety of operating modes. A fuzzy logic style of control may offer several advantages for this process as may be well suited for use with a MIMO system as well as both linear and non-linear processes. In such a control, input variables, output variables, or both, may be converted from hard scalar numbers to "fuzzy" sets which are represented by a suitable linguistic terms (e.g., a descriptive and/or relative terms, such as "big" or "small"). Thus, the control may make it possible to convert actions that a manual operator may perform into an automated operation. For example, the controller may interpolate and/or extrapolate input values, output values, or both by employing a series of "if-then" rules. Each variable may have its own unique "fuzzy" set assigned to it, which may be arranged and/or processed independently of other variables. For example, a beam power control operation may be independent of an X-Y deflection operation.

Examples of simple and complex control inputs and control outputs may include one that monitors for a predetermined condition and then adjusts one or more (e.g., preferably at least two) processing parameters in response to information from the monitoring. For example, a Simple Single Input Single Output (SISO) control may be employed where the melt pool width is monitored for a predetermined condition and the control then adjusts one or more processing parameters (e.g., an energy beam condition such as power) to alter the monitored condition. A Complex Multiple Input/Multiple Output control may include monitoring the melt pool width, melt pool shape, and/or peak temperature bias. Based upon information acquired from the monitoring, the controller may then adjust one or more processing parameters (e.g., at least two parameters, such as the energy beam condition, the wire feed rate, and/or beam deflection). A closed loop electronic control device may employ fuzzy logic, Fast Fourier Transform (FFT), software signal processing, or any combination thereof to alter a processing condition in response to a detected condition.

The time lapse between when a melt pool deposit is formed and when a condition is altered in response to a detected condition is rapid. For example, the response time may be about one minute or less, about 30 seconds or less, about 10 seconds or less, about 5 seconds or less, or even about 1 second or less. Thus, substantially real-time condition adjustment is possible.

For testing and verification, at least one accelerometer optionally may be attached to the equipment to measure the gravitational forces and accelerations. Additionally, the process parameters may be recorded on the same time basis as the process monitoring instrumentation outputs. Examples of process parameters that may be monitored are: sealed housing environmental parameters (for example, temperature); beam parameters (for example, current, voltage, deflection and focusing coil parameters, raster patterns); vacuum levels (for example, pressure level); rate and location parameters; and wire feeder control parameters (for example, rate, start, and stop). A computer, having a user interface, may be employed for commanding and controlling the fabrication process. A human operator may evaluate the overall operation of the energy emission device, the material delivery device, positioning mechanisms, vacuum operating parameters, or any combination thereof. Though the objective of the present teachings is to form an automatic system, some aspects of the present teachings may be used in a process that requires human intervention. The closed loop electronic control device may be configured to make the appropriate command inputs through the monitoring system and control software, or both, to manage the various systems of the layer manufacturing process.

The present teachings may further provide a method (e.g., process) for layer manufacturing of a three-dimensional work piece. For example, the layer manufacturing process may include feeding raw material in a solid state to a first predetermined location. The raw material may be deposited onto a substrate (e.g., work piece support) as a molten pool deposit under a first processing condition. The molten pool deposit may be monitored for a preselected condition (e.g., using the monitoring system as described previously). Information about the preselected condition of the monitored molten pool deposit may be compared with a predetermined desired value for the preselected condition of the monitored molten pool deposit, such as by use of the closed loop control device previously described, and the first processing condition may be automatically altered (e.g., by the closed loop control device) based upon information obtained from the comparing step. The molten pool deposit may be solidified and/or allowed to solidify. The steps may be repeated at one or more second locations for building up layer by layer a three-dimensional work piece.

Any comparing step performed by the control device may be performed in any suitable manner. As indicated, one possible approach is to use "IF X AND Y THEN Z" rules, which may employ linguistic variables.

The process may further include the step of translating one or any combination of the previously described apparatus components such as the material delivery device, the energy emission device, the work piece support (e.g., substrate), or the detector during use of the apparatus.

The step of feeding raw material may include advancing a metal wire feedstock (e.g., having an average diameter of less than about 5 mm) through a wire feed device that may include a plurality of opposing spaced apart rollers.

During the monitoring step, the detector may optically monitor at least one molten pool deposit. More particularly, the monitoring step may include monitoring a condition associated with the molten pool deposit selected from bulk average temperature of the molten pool deposit, temperature gradient within the molten pool deposit, surface topography of the molten pool deposit, the presence of any liquid-solid interface in the molten pool deposit, surface profile of the molten pool deposit, chemical analysis of the molten pool deposit, or any combination thereof. The preselected condition of the monitored molten pool deposit may be a predetermined value that is stored in memory of a computer processing system. The preselected condition of the monitored molten pool deposit may also be a value of a previously measured molten pool deposit of the same work piece, a different work piece, or both. The information obtained from any monitoring step may be stored in memory and may be used subsequently to repair or replace a portion of the work piece. Any monitoring step may include monitoring at least one molten pool deposit in the absence of applying an external influence to induce oscillations of the weld pool deposit.

In the monitoring step, the orientation of the detector, the reflective substrate, or both, relative to a first location about the melt pool, may be generally constant so that information about the preselected condition of the molten pool may be obtained from generally similar locations of the melt pool as the melt pool progresses during the deposition. In another feature of the monitoring step, the orientation of the detector, the reflective substrate, or both relative to a first location about the melt pool may be generally variable so that information about the preselected condition of the molten pool may be obtained from various locations (e.g., progressively scanning) of the melt pool as the melt pool progresses during the deposition.

The step of automatically altering the first processing condition to a different processing condition may be performed by one or more electronic processing units (e.g., computer). The step of automatically altering the first processing condition to a different processing condition may include altering one or more conditions previously discussed herein. For example, the location of any device for supplying energy to melt the raw material; the location of any device used for feeding the raw material; the location of any platform upon which a work piece is built; the pressure of any environment in which the processing is performed; the temperature of any environment in which the processing is performed; the voltage supplied to melt the raw material; the beam used for any electron beam source of energy for melting the raw material; the feed rate of the raw material; the composition of the deposited material; changing the temperature of the work piece; the temperature of the platform; or any combination thereof, may be altered.

The methods may further include the step of repairing a damaged portion of the work piece by locating a stored monitored location that is relative to the damaged portion of the work piece, changing the preselected value to the stored monitored value; depositing melted raw material at the damaged portion while monitoring the deposited material until a second monitored value is determined that is the same as the preselected value; and advancing the deposition of melted raw material until a second monitored value is determined that is the same as the preselected value. The method may include the step of utilizing a proximity device (e.g., laser) to measure the substrate distortion and subsequently map out the Z location for each deposition pass. The closed loop control may be used to maintain a consistent melt pool, wherein height profiling may also be incorporated. Height profiling may be utilized in a pre-scan mode with a measurement accuracy of generally up to about 0.8 mm (e.g., about 0.10 mm to about 0.30 mm).

The establishment of processing parameters may be by trial and error. It may be based upon historical experience. It may be based upon one or more test methodology. By way of example, one approach may include comparing results of at least one deposition test run with known values obtained from a reference structure having known values. The reference structure having known values may be placed in a predetermined known location within the system. Images may be taken with a detector and compared against known data about the reference structure having known values, and adjustments may be made to reduce the differences between the measured data and the known data. For example, the parameters may be varied above and below the baseline parameters (e.g., in terms of focus) to iteratively find optimal settings. Each test may produce one or more digital file that contains collected data. A test log may be employed for manual entry by an observing operator. Resulting images may be evaluated against known values; (e.g., contrast between known features/signal to noise, accuracy of features in the X-Y plane, and depth of field sensitivity in the Z-direction).

The present teachings may include an article of manufacture made using the LM method, the LM apparatus, or both. The method of making the articles may result in a near net shape part that may be ready for finish machining. The article of manufacture may be an original equipment component, a replacement part, or a repaired original equipment component. The article may be heat-treated subsequent to its layer by layer manufacture. The article may be an aircraft component, a rocket component, a marine craft component, a railcar component, an automotive vehicle component, a chemical processing component, a turbine component, or a space vehicle component.

The article may exhibit a resulting substantially homogeneous microstructure, which is obtained throughout at least about 50% (and more preferably at least about 80%) of a section thickness of the article. For example, the article may be a substantially homogeneous microstructure having a plurality of columnar grains that is obtained throughout at least about 50% (and more preferably at least about 80%) of a section thickness of the article.

Relatively large articles (e.g., greater than 750 $cm^3$) may be metallic and may be made (e.g., the processes being completed) in a period of less than about 150 hours (e.g., less than about 100 hours, preferably less than about 50 hours, or even more preferably less than about 20 hours) for each article. The article may be prepared directly from computer-aided design data. The article of manufacture may have an overall weight of at least about 10 kg, and may be made in a period of less than about 20 hours. For example, an article weighing about 60 to about 150 kg (or more) may be made in a period of no longer than about 20 hours.

The article may be prepared using a process, apparatus, or both that may be: free of a laser, prepared from a continuous deposition of each individual layer, prepared from an intermittent deposition of each individual layer, prepared in the absence of processing condition adjustment by a human during layer by layer buildup, or any combination thereof. It may be free of an ultrasonic detection method.

Any depositing step may be performed so that the molten pool deposit undergoes a substantially continuous change in thermal condition in three-dimensions throughout the process. The steps may be performed at a rate sufficient to deposit successive layers at least about 2.5 kg of the raw material per hour, preferably at least 3 kg per hour (e.g., about 3.3 to about 6.8 kg per hour). The steps may be performed at a rate sufficient to deposit the raw material as a plurality of beads that define successive layers having an average bead width of about 10 to about 15 mm (e.g., about 12.7 mm) at a rate of at least about 25 cm of bead per minute (e.g., about 35 to 80 cm per minute or higher). The process may be interrupted for a period (e.g., of at least one minute, one hour, two hours, one day, or longer) prior to completion of the work piece, and may be resumed after complete solidification of the work piece has occurred.

Any material delivery device may include a wire feed device (e.g. a wire guide) that includes a plurality of opposing spaced apart rollers that advances a wire feedstock. Any detector or sensing device may include a mechanism that intermittently acquires data about deposited material (e.g., at a rate faster than about 25 images per second). Any detector or sensing device may include a shutter mechanism located within an evacuated chamber that reduces exposure of the detector to vapors from the raw material.

The following process steps and features may be employed with any of the embodiments or devices taught herein. The following features may be employed separately or in combination with any of the embodiments taught herein. The process may use a raw material that includes a metal selected from one or any combination or alloy of metals selected from titanium, aluminum, iron, inconel, cobalt, stainless steel, niobium, tantalum, copper, bronze, brass, beryllium copper, or tungsten. The process may be interrupted for a period (e.g., of at least one minute, one hour, two hours, one day, or longer) prior to completion of the work piece, and is resumed after complete solidification of the work piece has occurred. The monitoring step may include, employing as the image generating device, a digital camera, a charged coupled device (CCD), a complementary metal oxide semiconductor (CMOS), or a combination thereof, and includes generating images substantially in real time at a rate of at least 25 frames per second. The monitoring step may include monitoring a condition associated with the molten pool deposit from a location substantially overhead of the molten pool deposit, and optionally the condition is selected from bulk average temperature of the molten pool deposit, temperature gradient within the molten pool deposit, surface topography of the molten pool deposit, the presence of any liquid-solid interface in the molten pool deposit, surface profile of the molten pool deposit, chemical analysis of the molten pool deposit, or any combination thereof. A preselected condition of the monitored molten pool deposit may be a predetermined value that is stored in memory of a computer processing system, the preselected condition of the monitored molten pool deposit is a value of a previously measured molten pool deposit of the same or a different work piece, or both. The step of automatically altering the first processing condition to a different processing condition includes altering one or more conditions selected from the location of any device for supplying energy to melt the raw material; the location of any device used for feeding the raw material; the location of any platform upon which a work piece is built; the pressure of any environment in which the processing is performed; the temperature of any environment in which the processing is performed; the voltage and/or current supplied to melt the raw material; the beam used for any electron beam source of energy for melting the raw material (e.g., by changing the power to generate the beam, the beam width, or both); the feed rate of the raw material; the feed angle of the raw material; the composition of the deposited material; changing the temperature of the work piece; the temperature of the platform; or any combination thereof. The information obtained from any monitoring step may be stored in memory and optionally is used subsequently to repair or replace a portion of the work piece.

The following process steps and features may be employed with any of the embodiments or devices taught herein. The following features may be employed separately or in combination with any of the embodiments taught herein. The process may further comprise the step of repairing a damaged portion of the work piece by locating a stored monitored location that is relative to the damaged portion of the work piece; changing the preselected value to the stored monitored value; depositing melted raw material at the damaged portion while monitoring the deposited material until a second monitored value is determined that is the same as the preselected value; and advancing the deposition of melted raw material until a second monitored value is determined that is the same as the preselected value. The monitoring step may include a step of protecting at least one exposed optical component of a detector from vapor disposition build-up onto the exposed componentry, so that the vapor does not build up and adversely affect measurement integrity. The monitoring step may include a step of cooling a detector by flowing a fluid in a housing of the detector for removing heat from the detector and the housing is separate and spaced apart from any block with an aperture of any vapor protection device. The process may further comprise a step of aligning components of an apparatus for performing the process using an alignment fixture. The step of monitoring may include a step of obtaining an optical image from a point of view that is substantially overhead of the melt deposit. The step of obtaining an optical image wherein (i) the image from the substantially overhead view of the molten pool deposit is generally shaped to include a generally C-shaped portion with a generally circular or elliptical shaped portion, which corresponds to an image of the feed material, that is within the C-shaped portion, and possibly extending outside the opening of the C-shaped portion, (ii) the step of automatically altering includes changing a process condition so that the shape of the image is substantially axially symmetrical; or both (i) and (ii). The orientation of any feed of the raw material may be automatically changed in response to information obtained during the monitoring step.

The method may include one or more steps of altering the energy emission device. The intensity of the energy emission device may be increased or decreased. The energy emission device may be aimed tangential, normal, or an angle therebetween at an exterior surface of a finished workpiece. The exterior surface may be heated. The exterior surface may be smoothed via gravity and heating (e.g., softening, melting, or a combination of both). The exterior surface may be sufficiently heated so that individual layers of the 3D part are no longer visible, the number of layers is reduced (e.g., if 100 layers are visible after smoothing only 30 layers are visible). For example, the exterior surface may be changed from a scalloped surface to a smooth surface. During smoothing of the exterior surface the method may be free of adding additional material. Smoothing may be free of any external contact on the exterior surface, other than the energy emission device (e.g., electron beam) and gravity. The energy emission device may be reduced in power, defocused, or both so that the energy emission device may be used to assist gravity in flowing the softened material. The energy emission device may assist in overcoming surface tension so that the material may move. The raster pattern may assist in smoothing an exterior of the article. The energy emission device may impart kinetic energy into the article so that the material flows. During smoothing of the exterior the part may be rotated or moved so that material may move in a predetermined direction to maintain or change a shape of the part or an energy emission device may rotate about the part to change a shape or material composition of the part. The smoothing may heat the part so that the part is pre-heated when placed in a forge. The smoothing may take place so that the part may be forged, hardened, fit within a mold, fit within a stamp, removing residual stress, or a combination thereof. The smoothing may occur before forging, repeated hitting with another object, or both. Each of the parts may be inserted into one or more forges. For example, a first forge may shape the part into a first shape and then a second forge may shape the part into a final shape. The object may be forged without being smoothed. The method may include a step of controlling the beam when two or more material delivery devices are used. Feedstock may be added into the beam emitted from the energy emission device and the beam may melt all of the feedstock simultaneously. The beam may be emitted from any of the energy emission devices discussed herein. The beam may alternatingly melt the feedstock. The beam may melt one feedstock and then the other feedstock by bending the beam back and forth, rastering the beam, pulsing the beam, or a combination thereof. For example, if one feedstock is in a leading side of the beam and a second feedstock is on a trailing side of the beam the beam may be bent back and forth between the leading feedstock and the trailing feedstock. The method may include a step of synchronizing the energy emission device and the material delivery device (e.g., synchronized pulsation). The energy emission device may be turned on or off, the intensity may be increased and decreases, the beam width may be increased and decreased, or a combination thereof and while the changes are being made the feed rate may be increased or decreased. For example, the feed rate may be turned off when the energy emission device is turned off. Thus, the feedstock may be moved and stop as the electron beam is turned on and off. The monitoring system may monitor the feed rate, temperature of a part, size of the melt pool, distance from a base substrate, or a combination thereof. The synchronized pulsation may refine an amount of heat being inputted into the work piece so that temperature of the work piece is controlled during the EBAM process. Synchronized pulsation may be applied to control a temperature of the feed wire, melt pool, article being formed, or a combination thereof. Synchronized pulsation may be used to create precise geometries. For example, if a point is desired then the power may be turned on and off so that as the cross-sectional area being formed decreases the part is not overheated such that the geometry sags or softens. Synchronized pulsation may be applied when small gauge wires are being used (e.g., 18 gauge or less, 20 gauge or less, 22 gauge or less, 24 gauge or less, 26 gauge or less, or even 28 gauge or less). The present process may be used to form one or more alloys. The process may be used to create two articles at the same time. Synchronized pulsation and the closed loop control may be employed together to control a temperature of the article so that as the article is being formed the precise geometries may be created. Pulsation may be used to join material together. Pulsation may join two or more components made of similar materials. Pulsation may join two or more components together that are made of different materials, dissimilar materials, dissimilar melting temperatures, or a combination thereof. For example, an allow and niobium and tantalum may be joined together. Pulsation may be used to heat one type of metal without heating a second type of metal. For example, niobium may be heated with a pulse and the heat allowed to dissipate into the tantalum so that the tantalum is heated indirectly versus being heated directly by the energy emission device. The pulsation may allow a lower melting point material to be heated with a shorter pulse duration then a higher melting point material so that both materials are melted substantially at the same time without the lower meting point material being super-heated.

The process may include a step of sandwiching two or more base substrates or plates together. Two or more base substrates may be connected together by a connection feature or connection method. The connection feature or connection method may join two or more base substrates by clamping, holding by gravity, banding, an adhesive, or a combination thereof. The two or more base substrates may be connected by a connection feature or connection method such as welding together, joining together, bonding together, or a combination thereof. The method of joining or bonding may include one or more of the methods discussed herein or a similar method. The method of joining or bonding may be performed by any of the methods or techniques discussed herein including, laser, arc welding, friction welding, a solid-state method (e.g., friction welding, forge welding, cold welding, roll welding, ultrasonic welding, hot pressure welding, explosion welding, diffusion welding), or a combination thereof. The base substrates may be sufficiently thick or strong so that even if stresses are not removed or reduced the base substrates prevent warping or bending of the work pieces. The base substrates may be connected to a large table or frame that prevents the base substrate from working, stressing, yielding, or a combination thereof. The base substrate may resist deformation before a secondary treatment, heat treating, relaxation, unclamping, or a combination thereof. The welds may be a spot weld. The welds may be a continuous weld. Preferably, the welds may be formed using the electron beam and the electron beam may melt the first substrate and the second substrate together. The welds, bonding, joining, or a combination thereof may be formed with or without adding additional material. The locations of the weld may be located outside of a location where an article of manufacture is to be formed. The step of joining (e.g., welding) may be performed inside of a peripheral edge of the first base substrate, the second base substrate, or both. The step of joining, bonding, welding, or a combination thereof may be performed prior to or after any additional material is added to the base substrates.

One or more articles of manufacture may be begun on a first base substrate. The base substrates may be rotated. One or more articles of manufacture may be begun on the second base substrate. The base substrates may be rotated. The building of the articles of manufacture and the rotation of the base substrates may be repeated a plurality of times (e.g., 5 or more, 10 or more, 15 or more, 20 or more, or even 25 or more times) until both sides have a complete article of manufacture. A temperature of the base substrates may be monitored. The base substrates may be monitored for flatness. A two-sided substrate may be formed by joining a first base substrate to a second base substrate. A two-sided substrate may be formed by joining a first base substrate to a second base substrate. The base substrates may be connected at one or more edges so that the base substrates may be rotated. The rotation device may connect to one or more peripheral edges, between a first base substrate and a second base substrate, a central region of the two-sided substrate, a central region of a first base substrate, a second base substrate, or a combination thereof. The base substrates may be rotated about an axis. The base substrates may be rotated without having to open the chamber. The base substrates may be connected to a rotation device. The rotation device may be one or more arms that articulate the two-sided substrate between two or more directions. The rotation device may include a motor, a gear box, or both. The rotation device may be part of the platform. The base substrates may be connected to one or more pivots that may be used to pick up the base substrates from the work piece support and then rotate the base substrates. The articles of manufacture may be subjected to one or more secondary treatments. Preferably, the articles of manufacture and base substrates are subjected to a heat treatment, a procedure intended to remove residual stressed built up during the layer manufacturing process prior to the separation step. An example of a method to remove residual stresses is to subject the component to a thermal heat treatment. Another method may include mechanical stress relief such as shot peening or vibratory methods. The base substrates may be separated. The welds may be cut. The bonding or joining may be dissolved, removed, mechanically removed, electrically removed, melted, cut, or a combination thereof. The welds, bonds, joints, or a combination thereof may remain intact and regions around the welds may be cut. The base substrates may be cut. Cutting may be performed with the electron beam, a water jet, a saw, a torch, any other cutting device that cuts metal, or a combination thereof.

The following features of the camera cooled housing may be employed with any of the embodiments taught herein. The following features may be employed separately or in combination with any of the embodiments taught herein. The cooled housing may include a front flange, seals, spacers, and back flange that are connected together by a fastening device, and the printed circuit boards are attached to the spacer by a connection device. The rear flange may include an opening for receiving an energy source. The cooled housing may include: (i) the mount adapter is located in the center of the front flange, (ii) the mount adapter is secured in the front flange using a plurality of pins; or (iii) both (i) and (ii). The cooled housing may include: a front flange, spacers, seals, and rear flange that are generally rectangular-shaped. The housing may have a height to width aspect ratio of about 2 to 1, preferably about 1.5 to 1, and more preferably about 1 to 1.2. The inlet and outlet may be located on opposite sides of the front flange in generally opposing facing relationship to each other. The cooled housing may include: (i) the spacers and seals include one or more heat sinks; (ii) one or more of the seals conduct heat; or both (i) and (ii). The cooled housing may include: a thermally conductive (e.g., at least about 2 W/m-K per ASTM D2214) polymeric-based interface seal is employed between the flanges, and optionally wherein the interface seal includes a relatively rigid polymeric (e.g., acrylic) elastomer surface layer having a relatively low tack surface, and an underlying relatively flexible polymeric (e.g., acrylic) support layer having a relatively low tack surface that may be more tacky than the surface layer. The camera cooled housing may be used in any of the process steps described herein.

The following features of the vapor protection device may be employed with any of the embodiments taught herein. The following features may be employed separately or in combination with any of the embodiments taught herein. The vapor protection device may include a gas supply conduit connected with the at least one fluid port for supplying the gas stream. The base portion and the cover portion may be separable from each other for accessing a flow chamber defined in the block and through which the gas stream is flowed. The vapor protection device may include a protective window, which is optionally edge sealed by opposing spaced seals, is housed in the base portion between the apertures of the cover portion and the base portion and the reflective substrate. The at least one fluid port may be defined by an elongated bore formed in a side wall of the base portion, and the bore has a longitudinal axis generally in the direction of elongation. The longitudinal axis of the elongated bore is substantially parallel with the optical path of an image between the reflective substrate and a camera. The vapor protection device taught herein may include a cooled housing taught herein. The vapor protection device may be carried on a common frame as with the cooled housing, but is spaced apart from the cooled housing so that the vapor protective device is located generally overhead of the molten pool deposit while the cooled housing is longitudinally separated from the vapor protective device and any gas supply line for the vapor protection device is free of connection with the cooled housing. The common frame may include a plurality of spaced apart elongated members along which the cooled housing, the vapor protection device or both may be mounted for adjustable and slidable translation relative to each other. The vapor protection device may be used in any of the process steps discussed herein.

The following features of the apparatus for layer manufacturing a three-dimensional article may be employed with any of the embodiments taught herein. The following features may be employed separately or in combination with any of the embodiments taught herein. The material delivery device includes a wire feed device that includes a plurality of opposing spaced apart rollers that advances a wire feedstock. The apparatus includes a detector that consists essentially of a camera that acquires images that are substantially overhead of the molten pool deposit at a rate of at least about 25 frames per second. The apparatus may be used with a cooled camera housing, a vapor protection device, an alignment fixture, or a combination thereof. The apparatus may be used to perform any of the process steps described herein. The apparatus may assembled using an alignment fixture described herein. The apparatus may be used to manufacture an original equipment component, a repaired original equipment component, or a replacement component made using the process described herein.

The following features of an article of manufacture may be manufactured using any of the embodiments taught herein. The following features may be employed separately or in combination with any of the embodiments taught herein. The article of manufacture may be heat-treated subsequent to its layer by layer manufacture. The article may be an aircraft component, a rocket component, a marine craft component, a railcar component, an automotive vehicle component, a chemical processing component, a turbine component, or a space vehicle component; and wherein the article is metallic.

FIG. 1A is a perspective view of a LM apparatus 10 including a chamber 22 including a material delivery device 12, an energy emission device 14, and a work piece support 16 that are mounted on an arm 28. An input device 20 is located external of the chamber and the input device is in communication with a closed loop electronic control device 300.

Figure 1B:
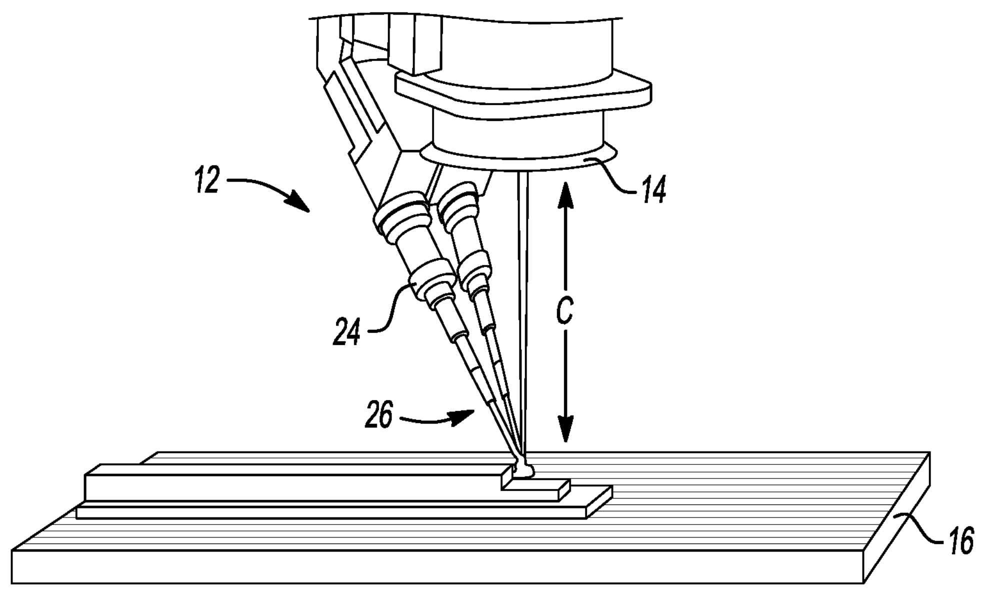
FIG. 1B is a perspective view illustrating a layer by layer deposition approach with multiple wire feeders.

FIG. 1B is a close-up view of a dual material delivery device 12 and an energy emission device 14. As shown, both of the material delivery devices 12 are proximate to each other. The energy emission device 14 includes an electron beam (C) that contacts wires exiting the wire guide tube 24 through the wire guide 26 to create a melt pool.

Figure 1C:
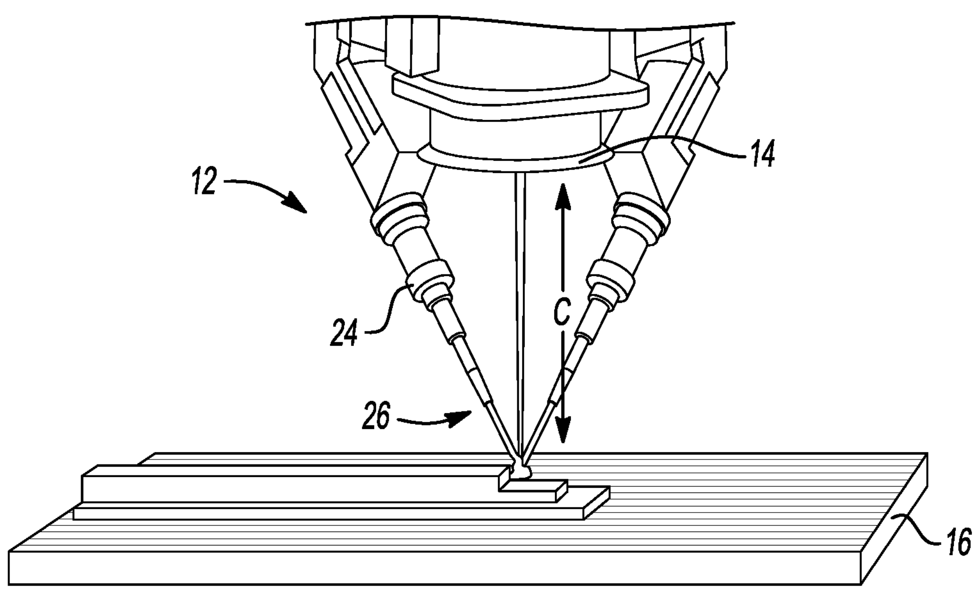
FIG. 1C is a perspective view illustrating a layer by layer deposition approach with one wire feeder in a leading position and one wire feeder in a trailing position.

FIG. 1C is a close-up view of a dual material delivery device 12 and an energy emission device 14. The material delivery devices 12 are rotated so that one material delivery device 12 is on a leading side of the electron beam (C) and one material delivery device 12 is on the trailing side of the electron beam (C). Each of the material delivery devices 12 include a wire guide tube 24 and wire guide 26 that assist in feeding a wire into the electron beam (C).

Figure 2:
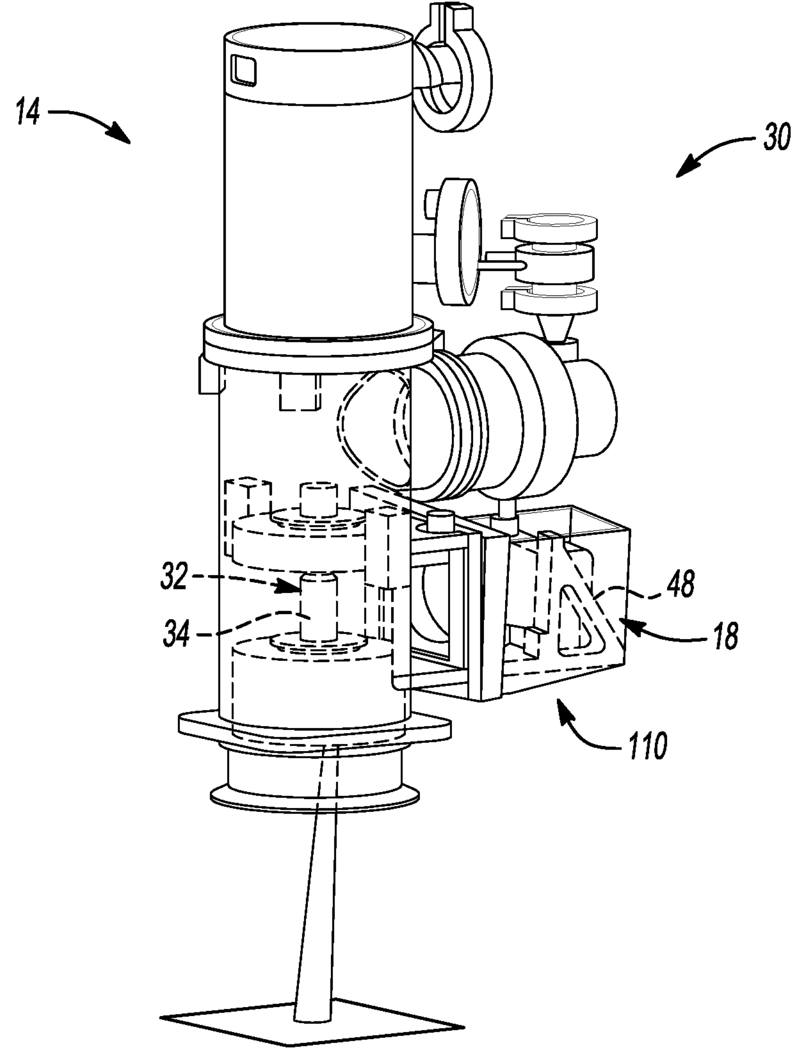
FIG. 2 is a perspective view of an illustrative energy emission device and monitor assembly of the present teachings.

FIG. 2 is a close-up view of an energy emission device 14 including a monitoring system 30 having a detector 18. The monitoring system 30 is connected to the energy emission device 14 via an attachment structure 110. The monitoring system 30 includes a detector 18, a detector housing 48, a vapor protection device 32 and a reflective substrate 34.

Figure 3A:
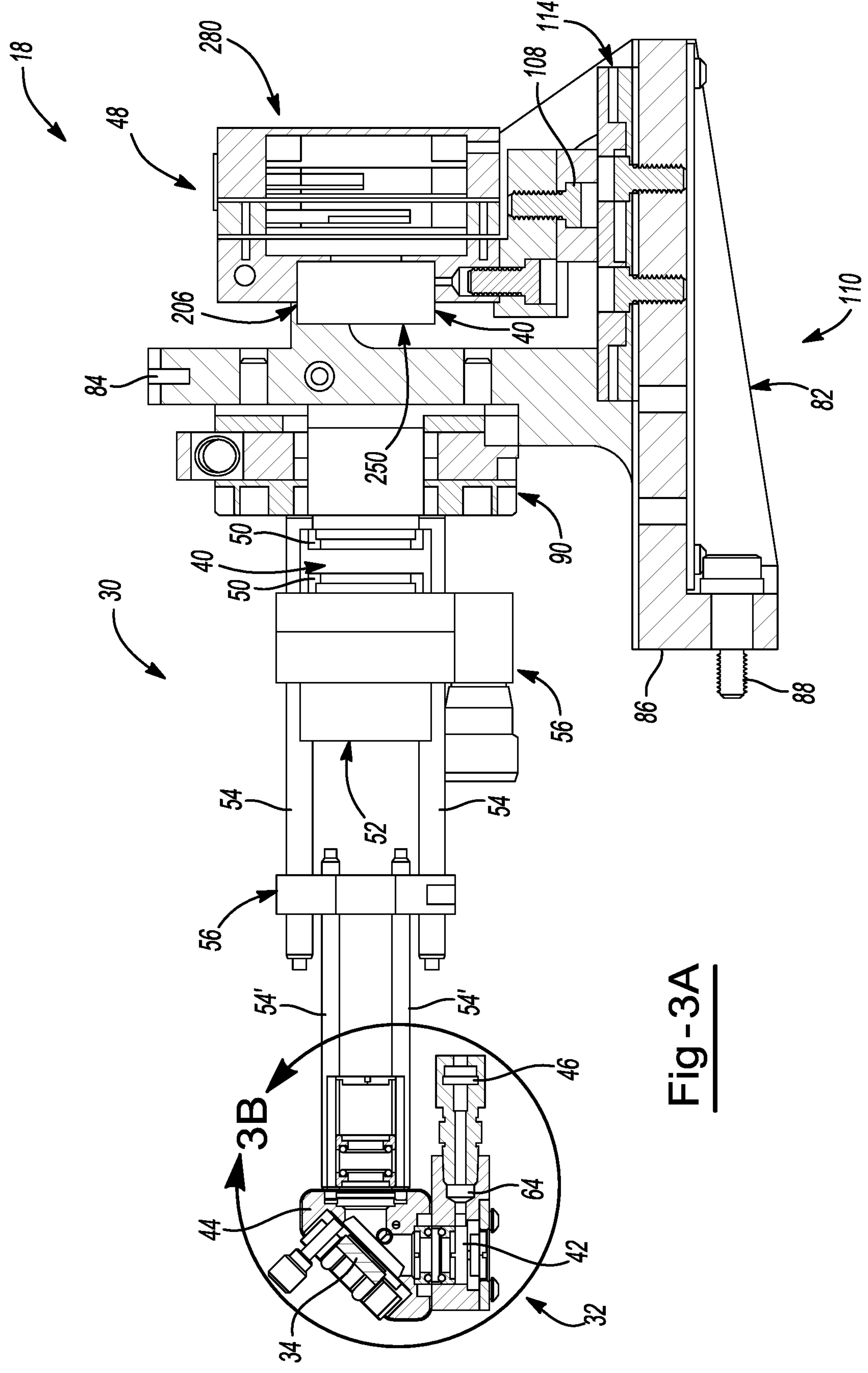
FIG. 3A illustrates a side view of an illustrative device for monitoring a molten pool deposit.

With reference to FIG. 3A-3B, the vapor protection device 32 may include a block that includes a base portion 60 and cover portion 62 (particularly a pin hole retainer member) that may be attached to an outer surface of the base portion. The base portion may include at least one port 64 (e.g., penetrating from a side wall, or for receiving a gas stream that may be controllably regulated). The port 64 may be in communication with a passage 66 which may be configured for receiving the barrier member with an aperture 42. The passage may be recessed so that the barrier member with the aperture 42 may be generally maintained in place once the cover portion 62 is secured to the base portion (e.g., the barrier member is fixed between the cover and the base portions, as can be seen in FIG. 3B). The passage 66 may include an opening (e.g., hole) so that gas received by the port 64 may be directed through the passage, and may contact the barrier with an aperture 42 and more specifically the pin hole aperture 102. Optionally, the cover portion, the base portion, or both may include one or more shoulder 68 upon which the barrier with an aperture may be rested, and the cover 62 may be attached onto a surface 60*a*. The cover and barrier with an aperture may be held in place by a pin-hole retainer 106. The pin-hole retainer 106 may include one or more retaining ring 112. The vapor protection device 32 may be further configured as a mounting structure for the barrier with an aperture 42 relative to the other components of the apparatus. The base portion 60 may be designed to provide a complementary fit with the barrier with an aperture 42. The base portion 60 may act as a protective structure directing the exhausted gas from the port 64 to adjacent components (e.g., mirror, windows, camera lens, or otherwise).

Figure 3C:
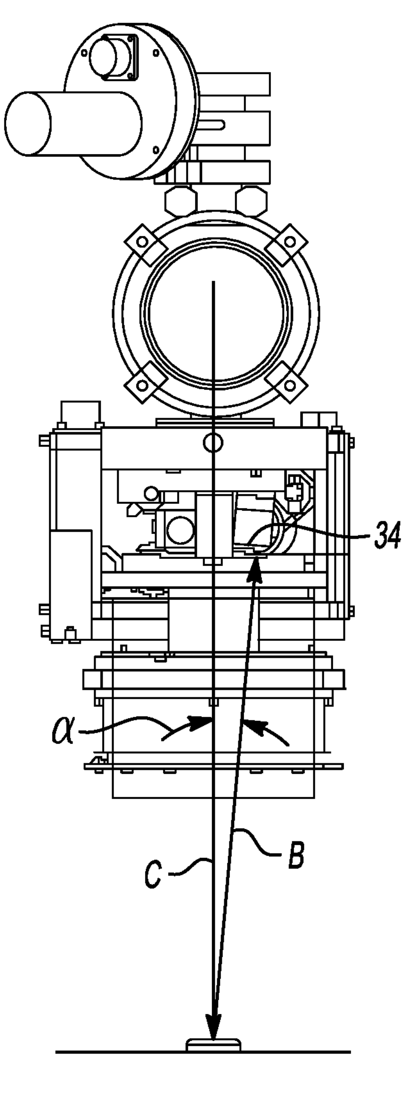
FIG. 3C and FIG. 3D illustrate an example of light beam orientation.
Figure 3D:
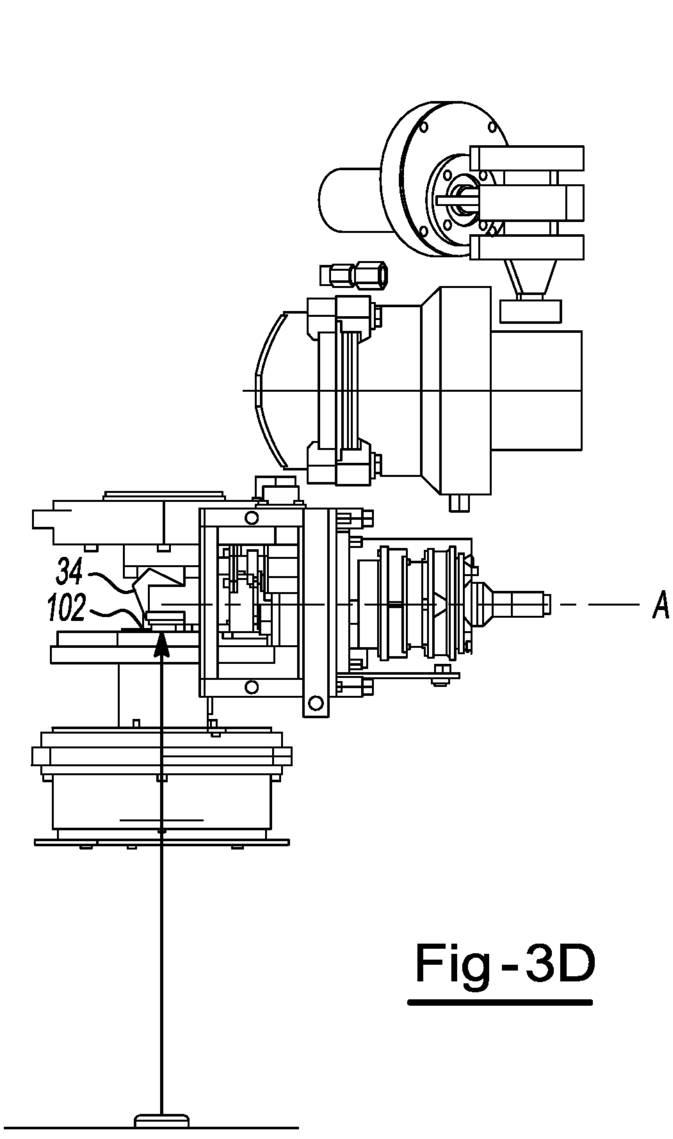

FIGS. 3C-3D illustrate the line of sight created from the substantially overhead viewing with the monitoring system. An electron beam (C) extends normal to a surface and a line of focus (B) extends from a substrate to a reflective substrate 34 where the line of focus (B) extends at an angle (α) relative to the electron beam (C). FIG. 3D illustrates the line of focus (A) from the reflective substrate 34 to the detector. The line of focus from the substrate to the reflective substrate is viewed through a pin hole aperture 102 that reduced contamination of the reflective substrate.

Figure 4:
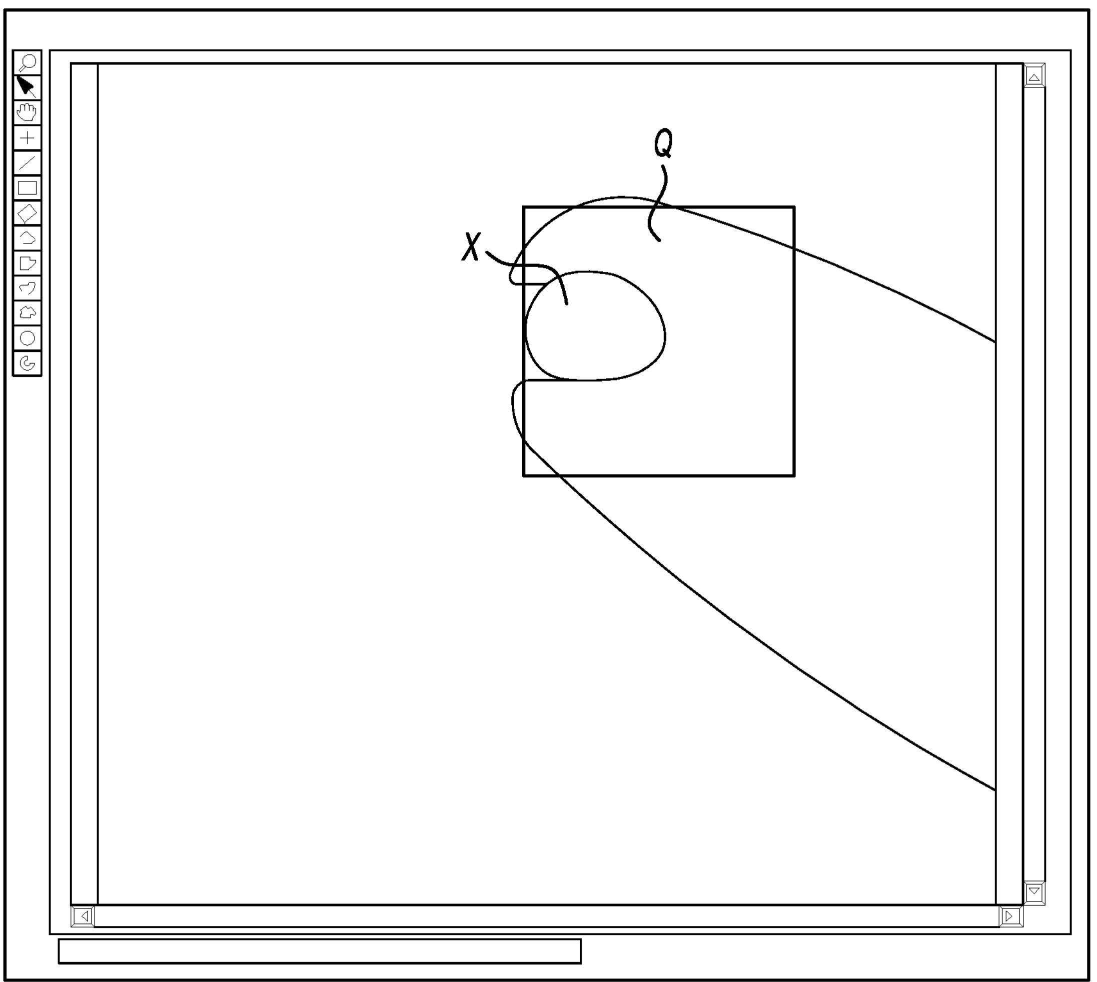
FIG. 4 is an example of an image obtainable using the present teachings.

FIG. 4 is a top view of melt pool from the monitoring system with a generally c shaped portion (0) and an elliptical shaped portion (X) being visible.

Figure 5:
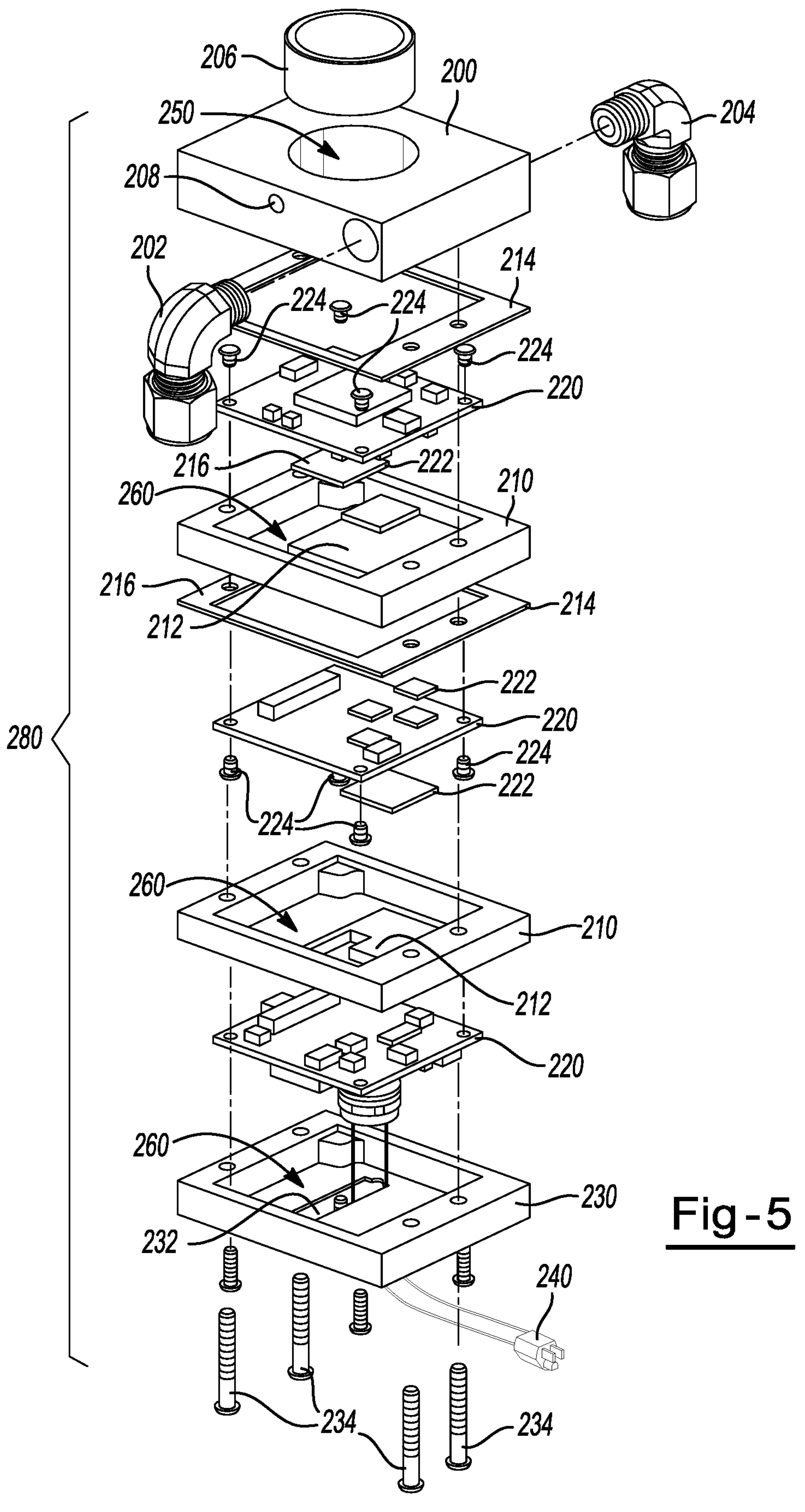
FIG. 5 is an exploded perspective view of a temperature controlled housing.

FIG. 5 is an exploded view of a cooled housing 280 that includes a front flange 200 (shown with a lens opening and an adapter) having a plurality of spacers 210 connected to the front flange 200. A plurality of seals 214 (e.g. polymeric interface seals) may be located in-between the spacers, in-between the front flange and a spacer, in-between the rear flange and a spacer, or any combination thereof. A rear flange 230 may be connected to the plurality of spacers and/or seals and located toward a remote end of the camera housing. The front flange, seals, spacer, and back flange form at least one cavity 260 into which at least one electronic component may be contained (e.g., a plurality of printed circuit boards 220 may be located within the cavity). The printed circuit boards may include at least one interface pad 222, an energy source 240, an image detector 250 (such as an array of pixel sensors located forward of the pad 222). One or more flanges (e.g. the front flange 200) may include an inlet 202 and an outlet 204 so that a fluid may be circulated through the front flange (e.g., at least across the length or width of the flange). For example, the inlet and the outlet are illustratively depicted as including a substantially perpendicular elbow joint fitting. The front flange may further include a suitable mount adapter 206 (e.g., a C-mount adapter, S-mount adapter, F-mount adapter, or the like (which may be located in a central region of the front flange)) that enables mounting of the associated hardware (not shown) (e.g., a camera lens) to the housing (i.e., front flange). The mount adapter may be secured in or to the front flange using a plurality of pins 208. For instance, one or more pins or other members may penetrate the side walls of the front flange so that the pins or other members can be brought into contact with the mount adapter 206 to resist the adapter from being pulled out. The flanges may be assembled together and connected such as by way of a plurality of suitable fasteners. For example, some or all of the front flange, seals, spacers, and back flange may be connected together by a fastening device 234. The fastening device may be a bolt, screw, pin, rivet, or the like. One or more of the printed circuit boards may be attached to the spacers or seals by a suitable connection device 224 (e.g. a fastener). The rear flange 230 may include one or more connection ports 232 that are configured to connect with a suitable energy source 240, or through which cables or other signal lines may be passed. The front flange 200, spacers 210, rear flange 230, or a combination thereof may include a vent hole 270 (e.g. through a side wall). The housing may be vented by applying a negative pressure to the vent hole 270, the housing may be vented by applying a positive pressure to the vent hole 270, or the housing may be vented without any forced ventilation.

As indicated, the flanges or the spacers may be configured to include one or more surfaces, brackets, or other support structures 212 to which a component (e.g., an electronic component) may be mounted or otherwise supported. For example, a support structure 212 may be configured with a recess, well, window, or other opening into which a component may be inserted (e.g., so that it achieves a friction fit, an interference fit, or both) so that at least a portion of the component is surrounded by the support structure when assembled. The support structure may be cantilevered relative to the surrounding wall, it may have openings therein, it may include a flat surface, or any combination thereof. The spacers and/or seals may further be configured to include one or more heat sinks (216).

The front flange, spacers, seals, and rear flange are generally rectangular in their peripheral shape, though other shapes may be used. Thus, they may have an aspect ratio that is the ratio of the width (W) to the length (L) of the rectangular periphery. For example, the housing may have an aspect ratio of about 2 to 1, preferably about 1.5 to 1, and more preferably about 1.2 to 1. Intermediate flanges may be generally rectangular rings.

The front flange, rear flange, and spacers may be made of an insulating material or a material that conducts heat (i.e. aluminum). The materials desirably will resist degradation throughout the temperature range to which they are exposed. The front flange, rear flange, or spacers may contain an inlet, outlet, or both. The inlet and outlet may be located on opposite sides of the front flange facing each other. They may be provided with suitable fittings for attachment to tubing for circulating a heat exchange medium. The image detector may include a charge coupled device (CCD) for sensing, a complementary metal oxide semiconductor sensor (CMOS), or some other active pixel sensor. One approach contemplates the selection of materials and configuration for the seals so that the seals function to conduct heat rather than insulate. For example, one or more of the seals may be made of ceramic, glass, acrylic, fiberglass, silicone, metal, or the like.

Either or both of the seals 214 of the interface pads 222 may be thermally conductive and generally resilient. For example, they may be polymeric. The at least one interface pad 222 may function as an interface pad, particularly a thermally conductive interface pad, and more particularly a thermally conductive polymeric interface pad. Some properties that the at least one interface pad 222 may exhibit include having: good softness, conformability to non-flat surfaces, excellent compressive stress relation, high thermal conductivity, good surface tack that leads to a low thermal resistance at its surface, good dielectric performance, and excellent durability for both long term thermal conductivity and electric insulation stability. The at least one interface pad 222 may be a non-silicone acrylic elastomer, and may be flame resistant (e.g., it meets requirements for certification under UL94). For example, the at least one interface pad 222 may include a flammability of about V-0, measured using the UL94 flammability test method.

One or more printed circuit boards may be disposed on a support 212, with an interface pad 222 between them (e.g. the interface pad is compressed between the circuit board and the support). The interface pads 222 maybe interferingly fit into a complementary receptacle in the support structure 212 of one of the flanges. Thus, it is possible to achieve a thermal conduction pad (e.g. a continuous thermal conductive path) within the housing between the electronics and the housing. The interface pads 222 may effectively fill air gaps between the electronic components and their support structures in the housing so that a thermal conduction path of a relatively large area is realized. The interface pads may have a surface that contacts the opposing electronic component over at least 30%, 50%, 75%, or more of the outer opposing face of the component, thus, spreading the area for heat transfer. It is thus possible to see how a compact geometry camera housing can be achieved by which heat transfer primarily by conduction (with or without convective assistance, e.g., a circulated fluid) is realized by the teachings herein, for cooling the internally housed electronic components. Meanwhile convective cooling may be used for cooling the housing that becomes heated by the conducted heat of the housed components. The teachings herein, thus, also contemplate steps of cooling internally housed electronic components by a thermal conduction arrangement (e.g. an arrangement that consists essentially of cooling by thermal conduction) to transfer heat to a housing body, and remove heat from the housing body using a fluid.

The at least one interface pad, the seals, or both may have a density ($g/cm^3$, @25° C.) of about 0.5 or more, more preferably about 1.0 or more, and still more preferably about 1.5 or more. The density may be about 5.0 or less, more preferably about 3.5 or less, and still more preferably about 2.5 or less (i.e. from about 1.9 to about 2.1), measured using the JIS K6249 test method. The at least one interface pad 222 may have a hardness of about 5 or more, more preferably about 10 or more, and still more preferably about 15 or more. The hardness may be about 100 or less, more preferably about 60 or less, and still more preferably about 35 or less (i.e. from about 16 to 30), measured using the Asker C test method. The at least one interface pad 222 may include a volume resistivity (ç-cm) of about $1.0\times10^{12}$ or more, more preferably about $1.5\times10^{12}$ or more, still more preferably about $2.0\times10^{12}$ or more. The volume resistivity may be about $6.0\times10^{12}$ or less, more preferably about $4.5\times10^{12}$ or less, still more preferably about. $3.5.0\times10^{12}$ or less (i.e. from about $2.7\times10^{12}$ to $3.4\times10^{12}$), measured using JIS K6249 test method. The at least one interface pad 222 may have a dielectric strength (kV/mm) of about 10 or more, even about 15 or more, and even about 20 or more. The dielectric strength may be about 75 or less, about 50 or less, or about 35 or less (i.e. from about 21 to 33), when measured using JIS K6249 test method. The thermal conductivity may be at least 1 (W/M-K) (e.g. about 2, 3, 4, or even higher), measured using ASTM E1225-04. The thickness of the material may range from about 0.5 to about 1.5 mm. Smaller or larger thicknesses are possible also.

The at least one interface pad 222, the seals 214, or both may include one or a plurality of layers. For example, it may include a surface layer and a core layer. It may also include a liner (e.g., a film liner). The layers may be polymeric. They may differ in terms of rigidity. For example, the surface layer may be more rigid than that core layer, or vice versa. They may differ chemically. They may be a thermally conductive elastomeric material. They may be an acrylic material. An example of a material that may be used for the at least one interface pad is Thermally Conductive Acrylic Interface Pad, available from 3M under the designations 5589H and 5590H.

When the housing is assembled together it will have a height (H) that spans from a forward face of the forward flange to a rearward surface of the rearward flange. The ratio of the height (H) to the width (W) and to the length (L) may range from about 1:2:2 to about 1:1:1 (i.e. about 1:1.2:1.3). Preferably, the front flange 200 will have the largest height when compared with the spacers and the rear flange. The ratio of the height of the front flange (F) to the overall height (H) of the housing when assembled together may range from about 1 to 1.5 to about 1 to 4 (i.e., about 1 to 2.5).

Figure 6A:
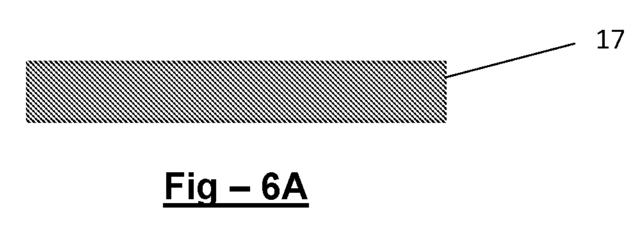
FIG. 6A is a side view of a plate.

FIG. 6A is a side view of a first base substrate 17.

Figure 6B:
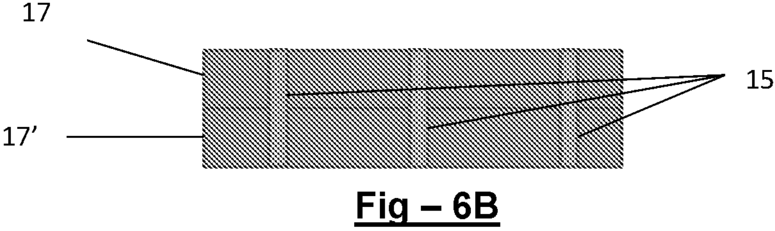
FIG. 6B is a side view of two plates joined together with the energy emission device.

FIG. 6B is a side view of a first base substrate 17 and a second base substrate 17' connected together view a plurality of connection features 15 (e.g., welds).

Figure 6C:
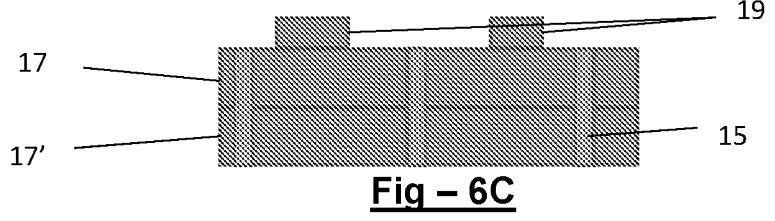
FIG. 6C is a side view of material being applied to a first side of the two plates welded together.

FIG. 6C is a side view of a first article of manufacture 19 being formed on the first base substrate 17 with the second base substrate 17' being connected thereto by connection features 15.

Figure 6D:
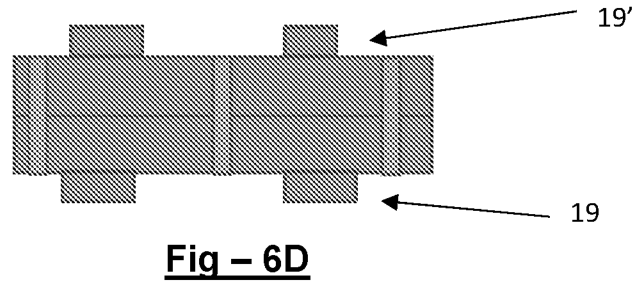
FIG. 6D is a side view of material being applied to a second side of the two plates joined together.

FIG. 6D illustrates the article rotated to a second side so that a second article of manufacture 19' is formed opposite the first article of manufacture 19 on a first side.

Figure 6E:
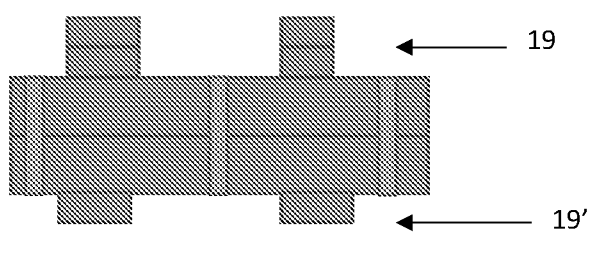
FIG. 6E is a side view of material being applied to a first side of the two plates a second time.

FIG. 6E illustrates the article rotated again so that the second article of manufacture 19' is out of the work zone and additional material can be added to the first article of manufacture 19.

Figure 6F:
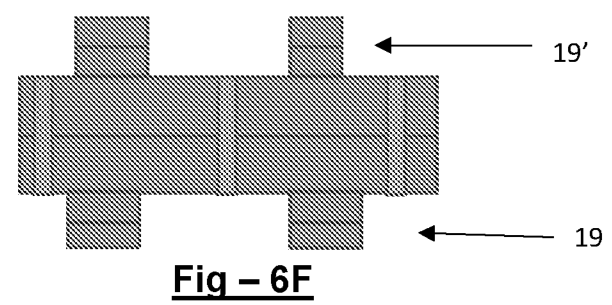
FIG. 6F is a side view of material being applied to a second side of the two plates a second time.

FIG. 6F illustrates the article rotated so that the first article of manufacture 19 is out of the work zone and additional material can be added to the second article of manufacture 19'.

Figure 6G:
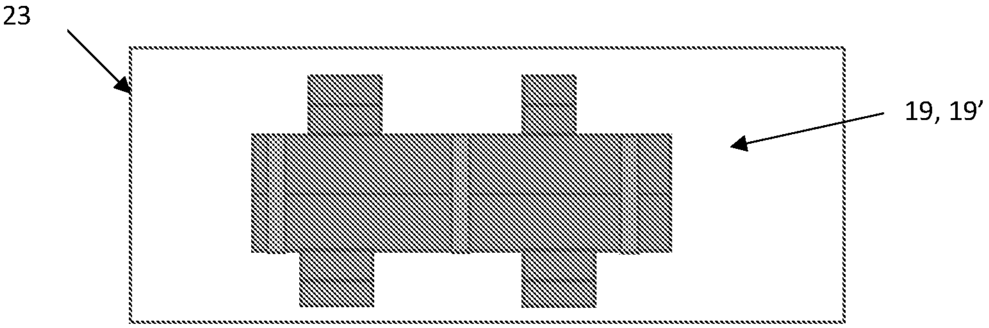
FIG. 6G illustrates a step of removing residual stress from the parts.

FIG. 6G illustrates the first article of manufacture 19 and the second article of manufacture 19' in a secondary process 23.

Figure 6H:
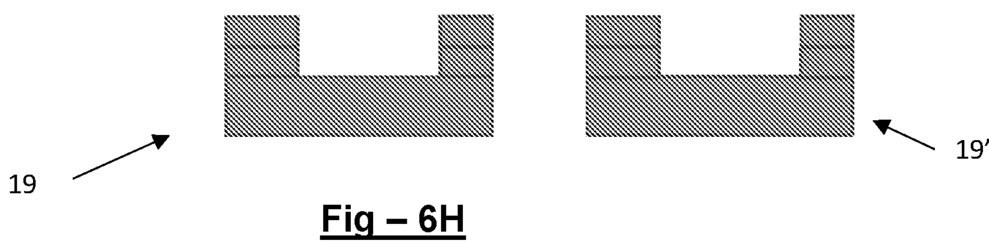
FIG. 6H illustrates the two plates and two parts completed once the parts are removed from being connected together.

FIG. 6H illustrates the first article of manufacture 19 and the second article of manufacture 19' cut apart so that there are two discrete parts.

Figure 6I:
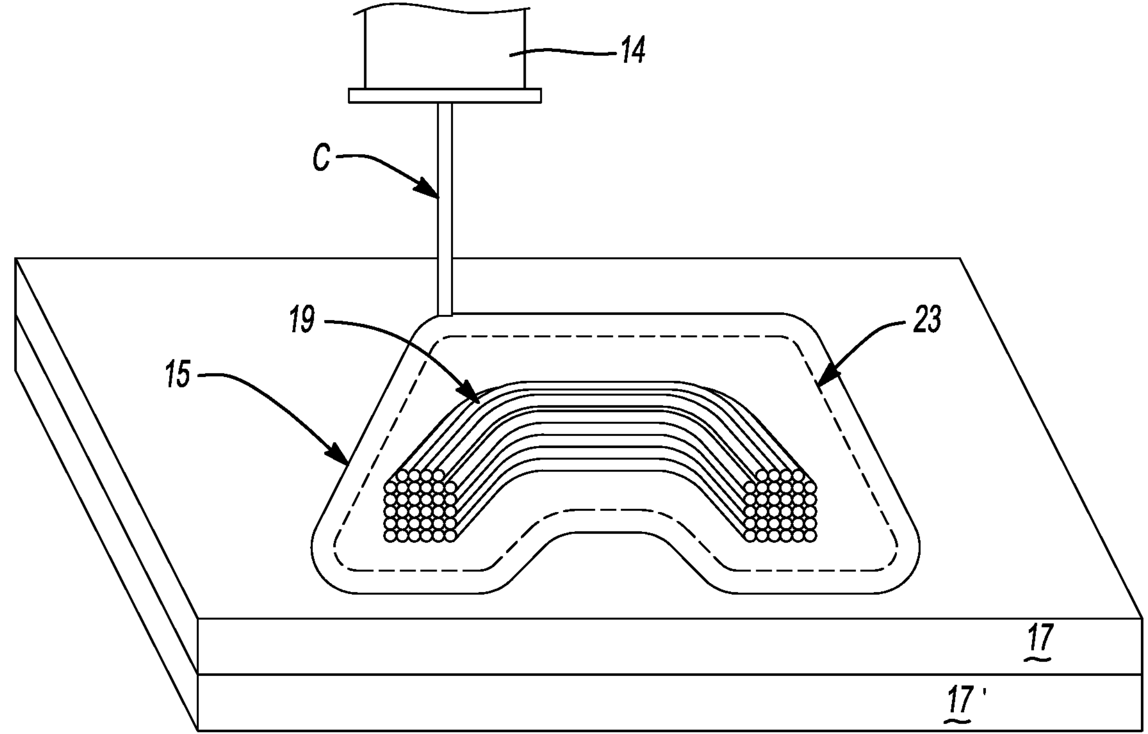
FIG. 6I is a perspective view of a dual base substrate with dual articles of manufacture being formed.

FIG. 6I is a perspective view of dual base substrates 17, 17' connected together with an article of manufacture 19 being created on a first side by an energy emission device 14 directing a beam (C) at the article of manufacture 19. The energy emission device 14 connects the first base substrate 17 and the second base substrate 17' together via a connection feature 15 that is shown as a weld. The weld 15 is proximate to a desired area for an article of manufacture but outside of the area for the article of manufacture. Once the articles of manufacture are created on each base substrate 17, 17', the articles may be released by performing a secondary process 23 such as cutting the base substrates to release the base substrates and the articles of manufacture.

Figure 7:
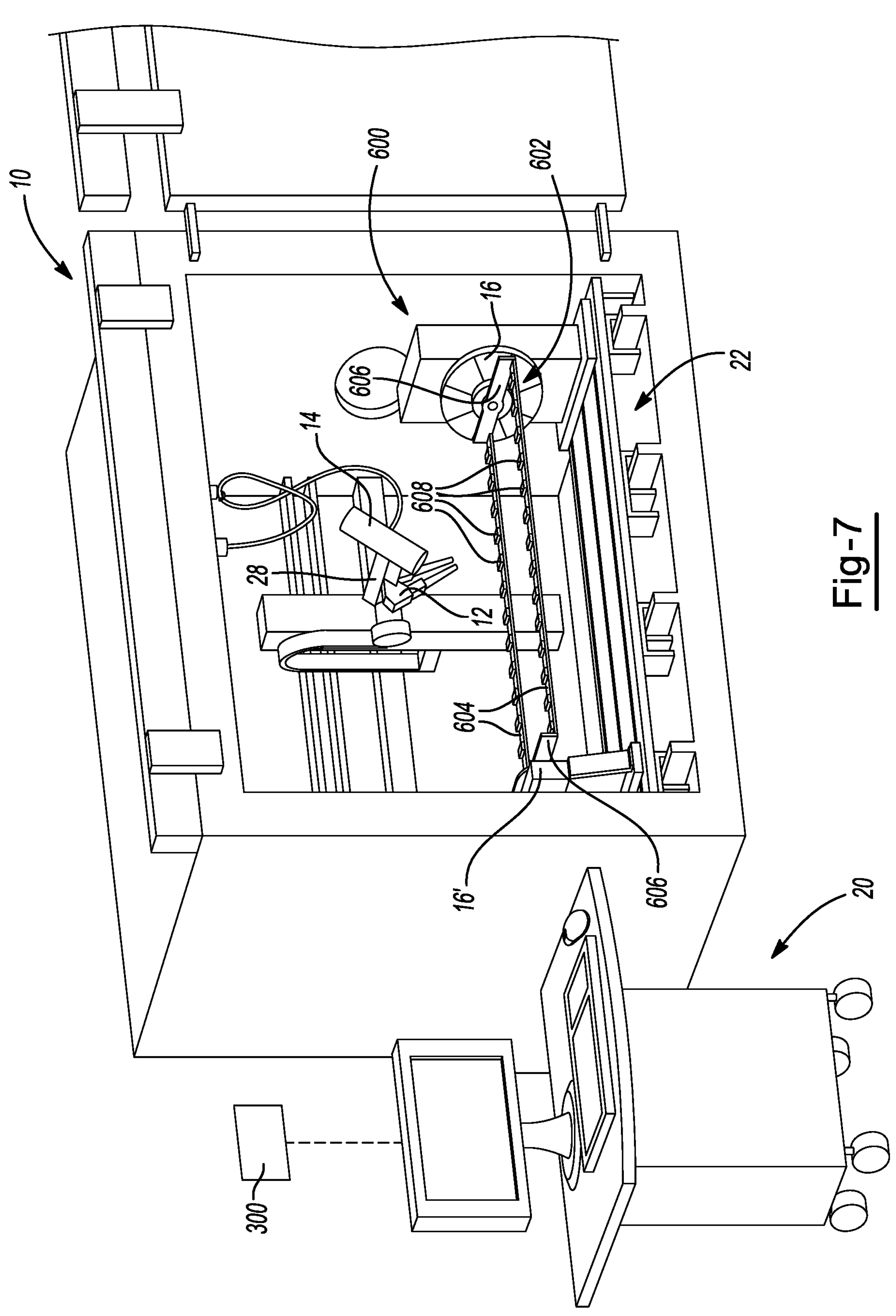
FIG. 7 is a perspective view of chamber including rotation device.

FIG. 7 is a perspective view of a LM apparatus 10 including a chamber 22 including a material deliver device 12 and an energy emission device 14 that is mounted on an arm 28. An input device 20 is located external of the chamber and the input device is in communication with a closed loop electronic control device 300. A rotation device 600 includes a work piece support 16 on a first end and a work piece support 16' on a second end that rotatably support a rotation frame 602. The rotation frame 602 includes a pair of longitudinal bars 604 connected together by connection bars 606. The connection bars 606 connect the rotation frame 602 to the work piece supports 16, 16'.

The longitudinal bars 604 each include a plurality of clamps 608 that connect two or more substrates (not shown) to the rotation device 600.

Structural relations, proportions, dimensions and geometries shown in the accompanying drawings are part of the teachings herein, even if not articulated verbally in the present detailed description. The teachings herein also contemplate variations to any relative proportions and dimensions shown in the drawings; e.g., variations within about ±10%, about ±25%, or even about ±50% are possible.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints. The specification of ranges herein also contemplates individual amounts falling within the range. Thus, for example, a range of 10 to 15 contemplates individually the amounts of 10, 11, 12, 13, 14, and 15.

The disclosures of all articles and references, including patent applications and publications, are incorporated by reference for all purposes. References to the term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of, or even consist of, the elements, ingredients, components or steps.

Plural elements, ingredients, components, or steps can be provided by a single integrated element, ingredient, component, or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. Likewise, any reference to "first" or "second" items is not intended to foreclose additional items (e.g., third, fourth, or more items); such additional items are also contemplated, unless otherwise stated. Any references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

The teachings of the relative positions, orientations, and proportions of components depicted in the accompanying drawings also form part of the teachings herein even if not expressly stated.

It is understood that the above description is intended to be illustrative and not restrictive. Many embodiments as well as many applications besides the examples provided will be apparent to those of skill in the art upon reading the above description. It is further intended that any combination of the features of different aspects or embodiments of the present teachings may be combined. The scope of the present teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

The invention claimed is:

1. A layer manufacturing apparatus comprising:

a) a main chamber;

b) one or more energy emission devices within the main chamber and configured to emit one or more electron beams;

c) one or more work piece supports located within the main chamber;

d) a plurality of material delivery devices located within the main chamber, wherein each of the plurality of material delivery devices includes a wire guide tube and a wire guide which are configured to feed a raw material into the one or more electron beams, and wherein the plurality of material delivery devices are movable relative to one another; and wherein the plurality of material delivery devices are connected to one or more spools that are located external of the main chamber.

2. The layer manufacturing apparatus of claim 1, wherein each of the plurality of material delivery devices deliver the raw material to one or more of the one or more energy emission devices, a melt pool, or both at a different angle relative to another of the plurality of material delivery devices.

3. The layer manufacturing apparatus of claim 1, wherein one of the plurality of material delivery devices is on a leading side of the one or more energy emission devices and another of the plurality of material delivery devices is on a trailing side of the one or more energy emission devices.

4. The layer manufacturing apparatus of claim 1, wherein the each of the plurality of material delivery devices are movable relative to the one or more energy emission devices and the one or more work piece supports.

5. The layer manufacturing apparatus of claim 4, wherein each of the plurality of material delivery devices are rotatable about one or more of the one or more energy emission devices, angle adjustable relative to the one or more energy emission devices, or both.

6. The layer manufacturing apparatus of claim 1, wherein the one or more spools are located within an adjacent chamber, and the main chamber and the adjacent chamber are both maintained in vacuum and the one or more spools can be removed from the adjacent chamber without breaking vacuum in the main chamber.

7. The layer manufacturing apparatus of claim 1, wherein the one or more work piece supports are rotatable.

8. The layer manufacturing apparatus of claim 7, wherein the layer manufacturing apparatus includes a rotation device which includes the one or more work piece supports and is configured to rotate the one or more work piece supports inside the main chamber.

9. The layer manufacturing apparatus of claim 8, wherein the one or more work piece supports include at least two work piece supports and the rotation device includes a rotation frame extending between the at least two work piece supports; and the rotation frame rotates with the at least two work piece supports.

10. A layer manufacturing apparatus comprising:

a) a main chamber;

b) one or more energy emission devices within the main chamber and configured to emit one of more electron beams;

c) one or more work piece supports which are located within the main chamber and rotatable;

d) a plurality of material delivery devices located within the main chamber, wherein each of the plurality of material delivery devices includes a wire quide tube and a wire quide which are configured to feed a raw material into the one or more electron beams, and wherein the plurality of material delivery devices are movable relative to one another; and wherein the plurality of material delivery devices are connected to one or more spools that are located external of the main chamber.

11. The layer manufacturing apparatus of claim 10, wherein each of the plurality of material delivery devices deliver the raw material to one or more of the one or more energy emission devices, a melt pool, or both at a different angle relative to another of the plurality of material delivery devices.

12. The layer manufacturing apparatus of claim 11, wherein one of the plurality of material delivery devices is on a leading side of the one or more energy emission devices and another of the plurality of material delivery devices is on a trailing side of the one or more energy emission devices.

13. The layer manufacturing apparatus of claim 10, wherein the each of the plurality of material delivery devices are movable relative to the one or more energy emission devices and the one or more work piece supports.

14. The layer manufacturing apparatus of claim 13, wherein each of the plurality of material delivery devices are rotatable about one or more of the one or more energy emission devices, angle adjustable relative to the one or more energy emission devices, or both.

15. The layer manufacturing apparatus of claim 14, wherein the one or more spools are located within an adjacent chamber, and the main chamber and the adjacent chamber are both maintained in vacuum and the one or more spools can be removed from the adjacent chamber without breaking vacuum in the main chamber.

16. A layer manufacturing apparatus comprising:

a) a main chamber;

b) one or more energy emission devices within the main chamber and which emits one or more electron beams;

c) one or more work piece supports which are located within the main chamber and rotatable;

d) a plurality of material delivery devices located within the main chamber, wherein each of the plurality of material delivery devices includes a wire guide tube and a wire guide which are configured to feed a raw material into the one or more electron beams, and wherein the plurality of material delivery devices are movable relative to one another;

wherein the plurality of material delivery devices are connected to one or more spools that are located external of the main chamber;

wherein the each of the plurality of material delivery devices are movable relative to the one or more energy emission devices the one or more work piece supports;

wherein one of the plurality of material delivery devices is on a leading side of the one or more energy emission devices and another of the plurality of material delivery devices is on a trailing side of the one or more energy emission devices; and wherein each of the plurality of material delivery devices deliver the raw material to one or more of the one or more energy emission devices, a melt pool, or both at a different angle relative to another of the plurality of material delivery devices.

17. The layer manufacturing apparatus of claim 16, wherein each of the plurality of material delivery devices are rotatable about one or more of the one or more energy emission devices, angle adjustable relative to the one or more energy emission devices, or both.

18. The layer manufacturing apparatus of claim 16, wherein the layer manufacturing apparatus includes a rotation device which includes the one or more work piece supports and is configured to rotate the one or more work piece supports inside the main chamber.

19. The layer manufacturing apparatus of claim 18, wherein the one or more work piece supports include at least two work piece supports and the rotation device includes a rotation frame extending between the at least two work piece supports; and the rotation frame rotates with the at least two work piece supports.

20. The layer manufacturing apparatus of claim 16, wherein the one or more spools are located within an adjacent chamber, and the main chamber and the adjacent chamber are both maintained in vacuum and the one or more spools can be removed from the adjacent chamber without breaking vacuum in the main chamber.

* * * * *